(12) United States Patent
Levy

(10) Patent No.: US 10,971,669 B1
(45) Date of Patent: Apr. 6, 2021

(54) EXB DRIFT THERMOELECTRIC ENERGY GENERATION DEVICE

(71) Applicant: George Samuel Levy, Irvine, CA (US)

(72) Inventor: George Samuel Levy, Irvine, CA (US)

(*) Notice: Subject to any disclaimer, the term of this patent is extended or adjusted under 35 U.S.C. 154(b) by 0 days.

(21) Appl. No.: 17/006,825

(22) Filed: Aug. 29, 2020

Related U.S. Application Data

(60) Provisional application No. 63/031,462, filed on May 28, 2020, provisional application No. 62/903,140, filed on Sep. 20, 2019.

(51) Int. Cl.
*H01L 35/04* (2006.01)
*H01L 35/32* (2006.01)
*H01L 35/34* (2006.01)

(52) U.S. Cl.
CPC ............ *H01L 35/04* (2013.01); *H01L 35/32* (2013.01); *H01L 35/34* (2013.01)

(58) Field of Classification Search
None
See application file for complete search history.

(56) References Cited

U.S. PATENT DOCUMENTS

| | | | |
|---|---|---|---|
| 10,439,123 B2 | 10/2019 | Fu et al. | |
| 2008/0295879 A1* | 12/2008 | Atanackovic | H01L 37/025 136/238 |
| 2018/0026555 A1* | 1/2018 | Levy | H01L 43/065 310/300 |
| 2018/0366633 A1* | 12/2018 | Fu | H01L 35/14 |

OTHER PUBLICATIONS

Muller, Collective cyclotron motion of the relativistic plasma in graphene, Physical Review B 78, 115419 (2008), pp. 115419-1 to 115419-9 (Year: 2008).*

* cited by examiner

*Primary Examiner* — Devina Pillay
(74) *Attorney, Agent, or Firm* — George S. Levy

(57) ABSTRACT

This invention describes a thermoelectric energy generation device based on the ExB drift in a semiconductor. The material is in depletion mode to avoid cancellation of the electric field by space charges. Under ideal, infinite mobility, zero-collision conditions, electrons and holes drift in the same direction, perpendicularly to the electric and magnetic fields, resulting in a zero-output current. However, when mobility is finite, their differing properties such as mobility, effective mass, and charge, manifest themselves as different drift velocity and drift direction resulting in a net output current and power. This invention leverages carriers' properties to accentuate these differences and maximize the output power. Quantities being optimized include, mobility, the product of mobility and the magnetic field, positioning electrodes along the drift axis of the overriding carriers, and adjusting the thickness of the semiconductor layer to accommodate the cycloid motion of one type of carrier but not the other.

31 Claims, 25 Drawing Sheets

EXB DRIFT THERMOELECTRIC ENERGY GENERATION DEVICE

This invention claims the benefit of U.S. Provisional Application No. 62/903,140, by the same inventor, titled, "ExB Drift Thermoelectric Energy Generation Device" filed on 20 Sep. 2019, which is hereby incorporated by reference. This invention also claims the benefit of U.S. Provisional Application No. 63/031,462 titled ExB Drift Thermoelectric Energy Generation Device, by the same inventor, filed on 28 May 2020 and which is also hereby incorporated by reference. Applicant claims priority pursuant to 35 U.S.C. Par 119(e)(i).

FIELD OF THE INVENTION

The present invention relates to thermoelectric devices that rely on the magnetic field, more particularly on the ExB drift in a thermoelectric material.

BACKGROUND

The ExB drift is a well-known, but counterintuitive phenomenon: in the presence of a magnetic field and an electric field perpendicular to each other, electrical carriers move along cycloid paths in the same average direction independently of their charge. The cycloids can be viewed as circles traced at a constant distance around a drifting point called guiding center. The motion of the guiding center determines the direction of the ExB drift. In a collision-less medium (one with infinite mobility) this motion is independent of the carriers' charge or mass, and perpendicular to both fields.

This invention relies on the ExB drift that occurs in a medium with finite mobility. In contrast, US patent application 20180026555 [1] and publication [2] by the same inventor relies on surface drift in a medium with infinite mobility, in which particles follow partial orbits interrupted by the surface. This surface drift occurs in a direction opposite to the cross product of E and B, in other words, in a direction opposite to the ExB drift of this invention. (see the figures and equations 5, 6, 9 and 12 of that application).

This invention is also different from U.S. Pat. No. 10,439,123 and publication [4] by Fu and Skinner which relies on an ExB drift in which particles are transported parallel to the E field (see their FIG. 1 and claims 1, 10 and 19). Their invention is restricted to materials with a band gap energy $E_G$ smaller than $k_B T$ which result in the saturation (non-depletion) of the material and a loss in performance. It is also restricted to devices that produce a heat flow in the direction of the E field (see their claims 1, and 19) and are accordingly limited in their configuration to utilize such a heat flow. Fu and Skinner's invention is also restricted to devices that produce an electric field in the direction of the heat flow (their claim 10) and are accordingly limited in their configuration to utilize such an electric field. Their application does not mention the production of any output current or output power.

SUMMARY OF THE INVENTION

The ExB drift is counterintuitive: In the absence of collisions, (a medium with infinite mobility) all particles drift in the same direction and with the same speed independent of their charge or mass. When positively charged and negatively charged particles are present in the same concentration, the net output current is zero.

However, when the mobility is finite, the properties of electrons and holes (such as mobility, charge, spin, and effective mass) manifest themselves as different ExB behaviors resulting in a net output current and a useful output power.

The ExB drift can occur in semiconductors but, only when the electric field is not canceled by space charges due to an overabundance of carriers. Therefore, the device must operate in depletion mode which can be achieved by controlling the carrier concentration. This is done by adjusting the level of doping or leaving the semiconductor intrinsic, by selecting a material with an appropriate band gap for the intended temperature of operation, and by designing the semiconductor layer thin enough to restrict the number of carriers to a level that does not saturate the semiconductor. In other words, the carrier concentration should not be so high as to take the semiconductor out of depletion mode.

The invention maximizes this ExB output power by leveraging the differences in the carriers' properties to accentuate their divergent ExB behavior. The carriers that contribute the most to the ExB drift are called the overriding carriers, and those that contribute the least, the overridden carriers.

The design strategy used in the invented device involves in part the following:

1. Selecting materials in which electrons and holes have widely different mobilities to accentuate their divergent ExB behaviors.
2. Applying a magnetic field such that its product with the mobility of the overriding carriers remains between 1 and 10, preferably between 1 and 3, and more preferably, around 2. For the overridden carriers, this product should remain outside of these limits. This product was found to be an important index in the power production of the device.
3. Positioning electrodes along an axis angularly closer to the drift axis of the overriding carriers than that of the overridden carriers. This geometry results in a greater capture of the overriding carrier current.
4. Designing the semiconductor layer thick enough to accommodate the cycloid paths of the overriding carrier but too thin for that of the overridden carriers.
5. Preferably, but not necessarily, using a magnetic field below about 1.5 Tesla, to allow the use of low maintenance permanent magnets as the source of the magnetic field.
6. Adjusting the size of the electric load and the thermal conductivity to the heat source to control the total power entering and leaving the device, allowing it to cool itself and reach a thermal equilibrium at its optimum operating temperature.

The ExB power output can be enhanced by selecting a material in which electrons and holes have widely different mobilities. Since the ExB drift requires carriers to follow cycloid paths, the mobility of the overriding carriers must be high enough to allow their mean free paths to span a significantly long portion of their cycloid paths. Conversely, the mobility of the overridden carriers should not have a mean free path long enough to span a cycloid.

Another method of enhancing the ExB power output is for the product, $\mu B_z$ of mobility $\mu$ and the magnetic field $B_z$ to be between 1 and 10, preferably between 1 and 3, and more preferably around 2. For a given material having a specific electron and hole mobilities, one can maximize the output power by using a magnetic field that optimizes this product for one type of carrier but not for the other.

Another method of enhancing the ExB power output is to position electrodes along the drift axis of the overriding carriers. When mobility is finite, the direction of the ExB drift is redirected away from the X axis because of collisions in the bulk of the material and because of back EMF (Electromotive Force) caused by load voltage. Because of their different properties this redirection is different for electrons and holes. Therefore, one can capture more current from the overriding carriers by positioning electrodes along an axis angularly closer to their drift angle than to the drift angle of the overridden carriers. For a semiconductor layer of thickness $\delta$ and length L, the electrodes could be positioned at the corner of the L$\delta$ rectangular cross section of the layer. For the overriding carriers with a mobility $\mu$, the preferred ratio L/$\delta$ is equal to $\mu B_z$, which corresponds to the cotangent of the drift angle from the X axis.

When a voltage is allowed to develop between the electrodes of the device (i.e., by applying a non-zero resistance load across the electrodes), the voltage that develops across the load produces a back EMF that modifies the electric field in the device, causing the drift direction to shift. Electrodes may have to be repositioned to account for this shift. A matched load, that maximizes power output, can account for such a shift.

Yet another method of enhancing the ExB drift power output is to design the thickness of the semiconductor material appropriately. Since electrons and holes have different effective masses, the sizes of their ExB cycloids are different, as they are commensurate with cyclotron orbits that they would follow in the existing magnetic field. The thickness of the semiconductor layer can be designed to fit cycloids for one type of carrier but not for the other, thereby increasing the ExB output power.

The source of the electric field can be placed on either side of the semiconductor layer. It can be insulated capacitor plates, electrets, or ferroelectrics. It can also be produced by surface doping the semiconductor layer, or by means of junctions embedded in the semiconductor. It can also be produced by joining materials with different work functions.

The semiconductor can be arranged in a stack of layers, interlaced with the source of electric field alternating in polarization. For example, the electric field could be pointing up in one layer, and down in the adjacent layers (or vice versa). This architecture allows each E field source to serve a dual purpose, servicing the layers above and below itself.

The magnetic field can be produced by electromagnets, superconducting magnets, and permanent magnets. The advantage of a permanent magnet is cost and low maintenance, its disadvantage is its limited magnetic field strength to about 1.5 Tesla which can be mitigated by using semiconductors with high mobility.

A device designed to operate at a given low temperature (for example below ambient), can sustain itself at this temperature by self-cooling. It can be made to reach and maintain this temperature simply by adjusting the thermal conductivity to the heat source to control the amount of heat that flows into the device, and by restricting the amount of power flowing out of the device and drawn by the electrical load.

A device designed to work optimally at one temperature but starting operation at a different temperature may not have a high enough performance to reach its optimal operating temperature on its own. If so, then it can be primed by coupling it with another device with different operating characteristics or by forcefully changing its temperature, for example by means of a Seebeck device. The device can also be primed by changing other parameters such as its electrical load, the thermal connection to the heat source, the magnetic field, or the electric field.

The device's underlying operating physical principle, the ExB drift, works over a wide range of operating temperatures (in particular, below 300K) and environments such as semiconductors, superconductors, and plasmas. Drifting electrical carriers can carry heat with them, producing a temperature gradient. Applications include heating, cooling, electrical energy production and lighting. ExB devices, embedded in electronics, can provide power as well as cooling.

One can also combine two different materials, the first in which electrons are the overriding carriers, and the second in which holes are the overriding carriers.

Another feature of this invention made possible by the presence of a magnetic field is that actual efficiency can be as high as the Carnot efficiency and that the Carnot efficiency can reach 100% implying that all input heat is converted to useful energy. Without waste heat, design configurations become possible that do not include a heat sink.

It is therefore an object of this invention to utilize the ExB drift as a thermoelectric generation mechanism.

It is another object for this thermoelectric effect to occur in a semiconductor operating in depletion mode.

It is another object to leverage the different properties of carriers, such as mobility, effective mass, and electric charge, to accentuate their different ExB behavior, thereby producing a useful power output.

It is another object of this invention to select materials with a band gap sufficiently high enough for a given temperature to keep the carrier concentration within a depletion level concentration.

It is another object of this invention to select a doping level light enough for a given temperature, (or to keep the material intrinsic) to keep the carrier concentration within a depletion level concentration.

It is another object of this invention to select a product of magnetic field and overriding mobility for the overriding carriers between 1 and 3, preferably around 2, and for the overridden carrier outside of 1 and 3.

It is another object of this invention for the layer of semiconductor to be thick enough to accommodate the cycloid motion of the overriding carriers, but too thin, for the overridden carriers.

It is another object of this invention to position electrodes along an axis closer to the drift axis of the overriding carriers than that of the overridden carriers.

It is another object of this invention for the source of the magnetic field to be a permanent magnet or a superconducting magnet or an electromagnet, but preferably a permanent magnet.

It is another object of this invention for the source of the electric field to be insulated capacitor plates, electrets, ferroelectric material, surface doping or junctions.

It is another object of this invention, if the source of the electric field is surface doping, and if the surface conductivity is so high as to short circuit the device, for the surface to be striated or reticulated.

It is another object of this invention for the layers of semiconductor material to be stacked and to be connected in series or parallel.

It is another object of this invention for the stack layers to alternatively support electrons and holes as overriding carriers.

It is another object of this invention for the semiconductor material to have high mobility and to provide an appropriate carrier concentration to avoid depletion for a given operating temperature. Such materials include indium arsenide, indium antimonide, indium arsenide antimonide, mercury cadmium telluride, indium phosphide, gallium indium arsenide, graphite, graphene, or diamond.

It is another object of this invention to have the semiconductor operating from a heat source temperature below 300K.

It is another object of this invention to have the semiconductor operating from a heat source temperature below 200K.

It is another object of this invention to alter the temperature of the semiconductor by adjusting the device's electrical load.

It is another object of this invention to alter the temperature of the semiconductor by adjusting the thermal connection to its heat source.

It is another object of this invention to utilize the thermal transport capability of the electrical carriers to produce a useful temperature gradient.

DETAILED DESCRIPTION

The description of this invention includes two sections. The first section presents a theory for the purpose of a better understanding of the invention, but it is understood that the invention is not tied to the theory. The second section discusses design optimization strategies and covers physical implementations.

Theory

This invention describes an energy generation device based on the ExB (pronounced "E cross B") drift [5,6] which occurs when charged particles are subjected to a magnetic field and an electric field applied to a single layer or multiple layers of semiconductor material.

The ExB drift is counterintuitive: In the presence of a magnetic field $B_z$ along the Z axis and an electric field $E_y$ along the Y axis, and in the absence of any collisions, (in a medium with infinite mobility), charged particles follow cycloid orbits whose guiding center moves with velocity $v_{ExB}=E_y/B_z$, along the X axis. All particles drift in the same direction and with the same speed independent of their charge or mass. If positive charged and negative charged particles have equal concentrations, then the positive particle current and the negative particle current are exactly the same, resulting in a zero-net current. The absence of collisions (notwithstanding being physically unrealizable) makes this ideal version of the ExB drift, noteworthy, but ultimately, not useful.

The ExB drift in a medium with finite mobility is more interesting. It allows differences in the properties of electrons and holes (such as mobility, charge, and effective mass) to manifest themselves in their ExB behavior. As a result, electron current and hole current do not cancel each other resulting in a net output current and a useful output power.

The following theory discusses first the case with zero-collision, and infinite mobility, and second, the case with collisions and finite mobility.

In the absence of any collisions the drift velocity $v_{ExB}$ occurs in a direction defined by the cross product ExB which is expressed in vector form as $$v_{ExB} = \frac{E \times B}{B^2} \quad (1)$$

Figure 1:
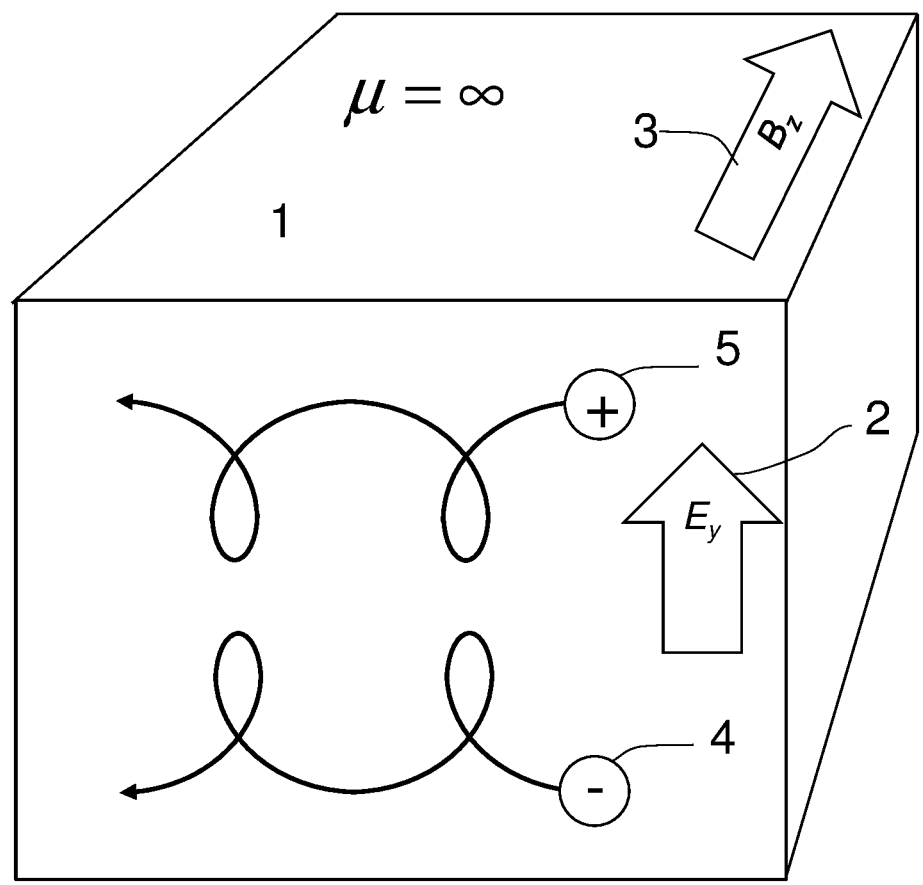
FIG. 1 illustrates the basic ExB drift effect when the carriers have infinite mobility, i.e., they experience no collisions. For an electric field along the Y axis and a magnetic field along the Z axis, carriers drift along the X axis, in the same direction independently of their mass or charge. The resulting current is zero.

As shown in FIG. 1, in the presence of an electric field $E_y$ 2 and a magnetic field $B_z$ 3 perpendicular to each other, charge carriers, electrons 4 and holes 5, held in a medium 1 which could be but is not restricted to a semiconductor) move along cycloid paths in an average direction perpendicular to both fields, which is shown in the drawing as the negative X direction. Cycloids can be viewed as circular orbits around a drifting point called the guiding center, and the drifting motion is in fact the movement of the guiding centers.

For a magnetic field $B_z$ along the Z axis and an electric field $E_y$ along the Y axis. Equation (1) can be simplified to express the drift velocity along the X axis as:

$$v_{ExB} = \frac{E_y}{B_z} \quad (2)$$

The associated current density $J_x$ is:

$$J_x = nq\frac{E_y}{B_z} \quad (3)$$

where n is the carrier density, and q is the charge of the carriers. The current density $J_x$ is accompanied by an Onsager reciprocal heat flow $Q_x$ in the same direction as the carriers independently of the charge of the carriers.

The shape of the cycloids depends on the relative magnitudes of the orbital velocity $v_o$ of the particles projected on the XY plane (perpendicular to $B_z$) and the drift velocity $v_{ExB}$ of the guiding centers which depends on $E_y$ and $B_z$.

The orbits are circles when $$\frac{E_y}{B_z} = v_{ExB} = 0 \quad (4)$$

The orbits are prolate cycloids when $$0 < \frac{E_y}{B_z} = v_{ExB} < v_o \quad (5)$$

The orbits are cycloids when $$\frac{E_y}{B_z} = v_{ExB} = v_o \quad (6)$$

The orbits are curtate cycloids when $$\frac{E_y}{B_z} = v_{ExB} > v_o \quad (7)$$

Figure 1A:
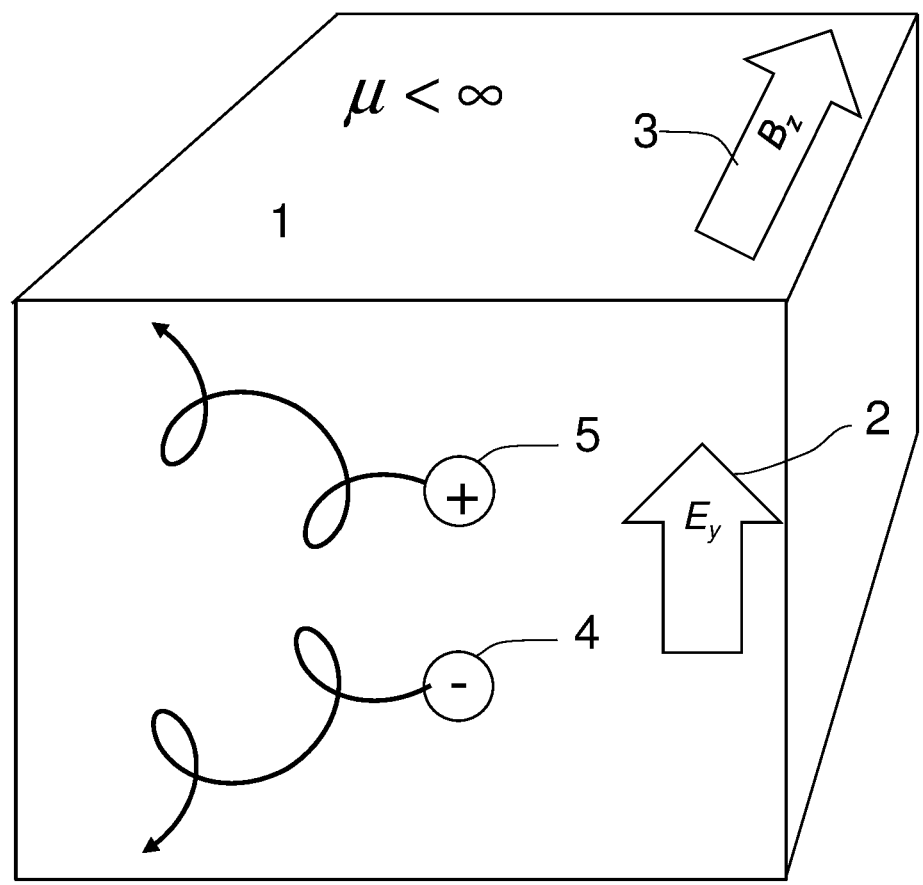
FIG. 1A shows that carriers with finite mobility follow an ExB drift with a reduced magnitude and in a direction deviating from the X axis. Electrons and holes experiencing different ExB drift produce a non-zero net current.

The above equation assumes that drifting particles do not experience collisions. In practice they do, as described by the Drude model [7]. The version presented below has been generalized to include a magnetic field. The resulting motion of the carriers is illustrated in FIG. 1A. As one can see from the figure, when mobility $\mu<\infty$ is finite, the drift is deflected away from the X axis for electrons 4 and holes 5. The equation of motion for a particle with an effective mass m*, a charge q and moving at velocity v, in an electric field E and a magnetic field B, follows a cycloid path described by $$F = \frac{d(m^*v)}{dt} + \frac{m^*v}{\tau} = q(E + v \times B) \quad (8)$$

where $\tau$ is the mean free time between collisions. (Note that the force acting on the particle comprises an inertial component d $(m^*v)/dt$ and a dissipative component $m^*v/\tau$.) Since the ExB drift is a steady-state phenomenon, one can rewrite equation (8) as $$\frac{m^*v_{ExB}}{\tau} = q(E + v_{ExB} \times B) \quad (9)$$

The mean free time can be expressed in terms of mobility $\mu$ $$\tau = \frac{m^*\mu}{q} \quad (10)$$

therefore, equation (9) can be expressed as $$v_{ExB} = \mu(E + v_{ExB} \times B)( \quad (11)$$

Since the current density is $$J = nqv_{ExB} \quad (12)$$

equation (11) becomes $$J = nq\mu E + \mu J \times B \quad (13)$$

For simplicity, let E be in the X and Y direction and B, in the Z direction. Rewriting equation (13) in terms of $E_x$ and $B_z$ for each component of J yields:

$$J_x = nq\mu E_x + \mu B_z J_y \quad (14)$$

and $$J_y = nq\mu E_y - \mu B_z J_x \quad (15)$$

As shall be further developed below, $\mu B_z$ is a useful quantity for describing the ExB drift. It is equal to $$\mu B_z = \frac{\lambda_{xy}}{r} = \omega \tau = \Delta\theta \quad (16)$$

where $\lambda_{xy}$ is the mean free path projected on the XY plane, r is the radius of curvature of a cyclotron orbit, $\omega$ is the cyclotron frequency, $\tau$ is the mean free time and $\Delta\theta$ is the angle subtended by an arc of length $\lambda_{xy}$ along a cyclotron orbit. Using equations (14) and (15), one can solve for $E_x$ and $E_y$ in terms of currents $J_x$ and $J_y$ $$E_x = \frac{1}{nq\mu} J_x - \frac{B_z}{nq} J_y \quad (17)$$

and $$E_y = \frac{B_z}{nq} J_x + \frac{1}{nq\mu} J_y \quad (18)$$

It is also useful to solve for $J_x$ and $J_y$ in terms of $E_x$ and $E_y$:

$$J_x = \frac{1}{1+(\mu B_z)^2} nq\mu E_x + \frac{\mu B_z}{1+(\mu B_z)^2} nq\mu E_y \quad (19)$$

and $$J_y = -\frac{\mu B_z}{1+(\mu B_z)^2} nq\mu E_x + \frac{1}{1+(\mu B_z)^2} nq\mu E_y \quad (20)$$

Equations (19) and (20) can be expressed in matrix form.

$$J_{xy} = \frac{nq\mu B_z}{\sqrt{1+(\mu B_z)^2}} \begin{bmatrix} \frac{1}{\sqrt{1+(\mu B_z)^2}} & \frac{\mu B_z}{\sqrt{1+(\mu B_z)^2}} \\ -\frac{\mu B_z}{\sqrt{1+(\mu B_z)^2}} & \frac{1}{\sqrt{1+(\mu B_z)^2}} \end{bmatrix} \frac{E_{xy}}{B_z} \quad (21)$$

Comparing equations (21) and (3) one gets the actual current output in terms of the ideal, infinite mobility current output:

$$J_{xy} = \frac{\mu B_z}{\sqrt{1+(\mu B_z)^2}} \begin{bmatrix} \frac{1}{\sqrt{1+(\mu B_z)^2}} & \frac{\mu B_z}{\sqrt{1+(\mu B_z)^2}} \\ -\frac{\mu B_z}{\sqrt{1+(\mu B_z)^2}} & \frac{1}{\sqrt{1+(\mu B_z)^2}} \end{bmatrix} J_{xy,\mu=\infty} \quad (22)$$

Figure 2:
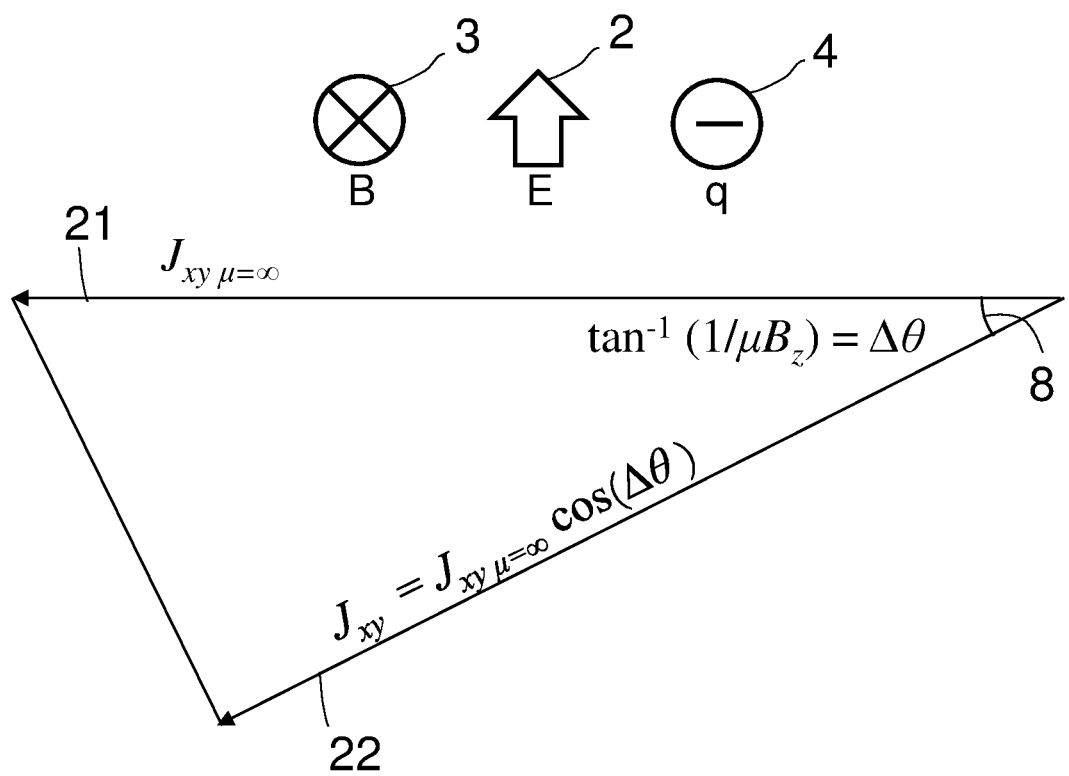
FIG. 2 shows a vector diagram in which the drift is modified in amplitude and direction by a finite mobility. Amplitude is reduced by cos (Δθ) and direction is rotated by angle $\Delta\theta=\tan^{-1}(1/\mu B_z)$ away from the X axis.

Yet another representation of this equation is $$J_{xy} = \cos(\Delta\theta) \begin{bmatrix} \sin(\Delta\theta) & \cos(\Delta\theta) \\ -\cos(\Delta\theta) & \sin(\Delta\theta) \end{bmatrix} J_{xy,\mu=\infty} \quad (23)$$

where $\tan(\Delta\theta) = 1/\mu B_z$. The cosine term $\cos(\Delta\theta)$ in front represents a scalar reduction of the maximum current $J_{xy,\mu=\infty}$, and the unitary rotation matrix, a redirection of the current. Equation (23) is represented by a vector diagram in FIG. 2. The ideal collision-less current $J_{xy,\mu=\infty}$ 21 is rotated by angle $\Delta\theta$ 8 and attenuated by the factor $\cos(\Delta\theta)$ to produce the actual drift current vector $J_{xy}$22.

Note that the ExB drift can be vectored, and turned on and off, by manipulating n, q, $\mu$, as well as $E_y$ and $B_z$. Maximizing the power output is a constrained optimization problem that requires selecting high values for n, $\mu$ and E, and $B_z$ subject to limitations imposed by material properties, fabrication capabilities, and/or other physical laws.

Furthermore, since electrons and holes have different effective masses and mobilities and can have different concentrations, their drifts can be controlled independently. The thickness of the semiconductor can also be adjusted to favor one type of carrier over the other by selectively interfering with their cycloid movement. For example, the semiconductor layer could be thick enough to accommodate the cycloid motion of the electrons but not that of the holes. In addition, electrodes can be positioned to capture more effectively the current produced by one type of carrier over the other.

When drifting conditions change, as for example at a surface (e.g., a boundary between two media), the charged particles can accumulate thereby producing local variations in particle density and voltages that can be used to convert thermal energy to electrical energy. It is understood that the change in the medium can be abrupt or gradual. Such changes include for example transitioning from a semiconductor that supports the ExB drift to connecting leads that does not. Such changes can be produced by connecting a load to the ExB device. The load resistance produces an accumulation of carriers at the contacts to the device, that generates a back EMF.

The flow of carriers in an ExB drift can also produce an Onsager reciprocal heat flow [8,9]. Furthermore, if the carriers have a concentration gradient, and are reversibly generated and annihilated (or emitted and absorbed), then a temperature gradient develops along the concentration gradient in accordance with Van't Hoff equation. This effect can be described by $$\frac{dT}{dx} = \frac{1}{N} \frac{E_y}{B_z} \quad (24)$$

In the presence of perpendicular magnetic and electric fields, a temperature gradient is generated perpendicular to both fields. This phenomenon is the reciprocal of the Nernst effect in which an electric field is generated transverse to a temperature gradient and a magnetic field.

This invention describes a device and method that use the ExB drift to convert thermal heat to electrical energy. Accordingly, a thermal connection is required between a heat source and the device. Obviously, for heat to flow from the heat source into the device, the temperature of the heat source needs to be relatively higher than the temperature of the device. It is therefore generally consistent with the invention for the heat source to be above ambient, at ambient, or even below ambient temperature, as long as the device is colder than the heat source.

The above theory provides only general and approximate guidelines and does not represent absolute limitations to the invention. It is understood that the invention is not tied to the theory.

Design Optimization

The invention maximizes this ExB output power by leveraging the differences in the carriers' properties to accentuate the differences in their ExB behaviors. This design strategy involves selecting the following:
1. The semiconductor material with properties capable of supporting the ExB drift of one type of carrier (e.g., electrons) but not the other (e.g., holes). These properties include the carrier's corresponding mobility and effective masses, the intrinsic carrier density, and the band gap.
2. The strength of the magnetic field and its sources thereof.
3. The strength of the electric field and sources thereof.
4. The geometry of the semiconductor layer, in particular, its thickness and its length.
5. The positioning of electrode connected to the semiconductor layer.
6. The size of the electric load matched to the device and that maximizes the power output.
7. The thermal contact between the semiconductor and the heat source that allows the device to reach thermal equilibrium and operate at a preferred temperature for one type of carrier but not for the other.

The invention also describes a stack geometry that facilitates heat flow and provides a compact configuration.

DEPLETION MODE. The ExB drift requires an electric field be present within the semiconductor. Therefore, space charges should not be allowed to be so large as to cancel this field completely. In other words, the semiconductor layer should operate in depletion mode across its whole thickness. A region of the material saturated with (opposite of depleted of) carriers and without an electric field, would not support the ExB drift and, in fact, would short circuit the intended output of the device.

Depletion mode can be achieved across the whole thickness of the semiconductor layer by selecting the semiconductor material, and by controlling the number of carriers and the electric field. This can be done in several ways:
1. Adjusting the doping to achieve the appropriate concentration n, for example using lightly doped or intrinsic material.
2. Selecting a material with an appropriate band gap $E_G$ above a maximum value, to maintain the semiconductor in a depleted mode. (too low a band gap would result in the saturation of the semiconductor).
3. Designing the semiconductor layer to have a thickness $\delta$ thinner than the size of the depletion zone.

Concentration is exponentially related to temperature, i.e., it is a function of $\exp(1/k_B T)$ where $k_B$ is Boltzmann's constant and T is temperature. Therefore, the depletion controlling measures suggested above need to be applied in the context of the intended operating temperature.

The thickness D of the depletion zone can be calculated in terms of the electric field and carrier concentration as follows. The total charge Q contained in a volume AD in the depletion layer is $$Q = nqAD \qquad (25)$$

where n is the charge concentration, q is the charge per carrier, and A is the area of the depletion layer. The capacitance across the depletion layer is $$C = \kappa \varepsilon_0 \frac{A}{D} \qquad (26)$$

where —K is the dielectric constant of the semiconductor, and $\varepsilon_0$ is the permittivity of free space. For a voltage $V=E_y D$ applied across the depletion layer, the charge displacement Q required to cancel $E_y$ is given by $$Q = CV = \kappa \varepsilon_0 \frac{A}{D} E_y D = \kappa \varepsilon_0 A E_y \qquad (27)$$

Combining equations (25) and (27), and making the simplifying assumption that the depletion zone follows a step function, yields its thickness.

$$D = \frac{\kappa \varepsilon_0}{q} \frac{E_y}{n} \qquad (28)$$

One needs to trade-off decreasing the number of carriers to ensure operation in depletion mode, with increasing carriers to maximize the total current output. Equation (28) indicates that the maximum carrier concentration $n_{Maximum}$ required to keep the semiconductor in depletion mode is $$n_{Maximum} = \frac{\kappa \varepsilon_0}{q} \frac{E_y}{\delta} \qquad (29)$$

where $\delta$ is the thickness of the semiconductor layer. A good compromise is for the depletion zone D to be between 1.5 and 4 times $\delta$: in other words, $1.5\delta < D < 4\delta$. Preferably, the depletion zone should be about 2.5 times $\delta$. (It is understood that, when one describes a depletion zone larger than the semiconductor layer, one refers to a depletion zone produced by the same combination of carrier concentration and electric field that would exist in a virtual very thick semiconductor slab.)

One should also recognize that the depletion zone hardly follows a step function. In fact, this function is smooth, and has no well-defined border. For example, specifying a layer thickness equal to, or slightly smaller than, depletion zone dimension specified in equation (28) does not lead to an abrupt stop in the operation of the device, but to a gradual decline in performance. In practice one may have to balance this constraint with other trade-offs such as operational and manufacturing requirements.

COMPLETE DEPLETION VERSUS PARTIAL DEPLETION. When an electric field is applied across a semiconductor layer, carriers migrate producing a concentration gradient across the layer highest at a first surface, and lowest at a second surface. The presence of carriers causes the electric field to acquire a gradient. The field is highest at the first surface and lowest at the second surface. If the carrier concentration starts out low enough, the whole layer remains a depletion zone state. However, if the carrier concentration starts out too high, the field can be non-zero at the first surface but zero at the second surface. The layer is then divided into two zones. A first zone in a depleted state, with a field (albeit non-uniform) which supports the ExB drift, and a second zone with no field, no ExB drift, but still plenty of carriers. The carriers in this second zone can short circuit the ExB drift generated by the first zone thereby adversely affecting the performance of the device. It is therefore important for the carrier concentration to be low enough to keep the semiconductor layer in a depletion zone state, completely, across its whole thickness. In contrast to this invention, the Skinner and Fu (U.S. patent Ser. No. 10/439, 123, claim 1) require that the band gap $E_G$ be less than $k_BT$. A small band gap results in a large carrier concentration, as indicated by equation (30)

$$n = \sqrt{N_c N_v} \exp\left(-\frac{E_G}{2k_B T}\right) \quad (30)$$

where $N_c$ is the effective density of states in the conduction band, $N_v$ is the effective density of sates in the valence band, T is the temperature and $k_B$ is Boltzmann's constant. Therefore, their requirement represents a minimum for the carrier concentration but not a maximum. In other words, Skinner and Fu do not guarantee complete depletion of their semiconductor layer which results in the short circuiting of their ExB effect and a lower performance.

BAND GAP SELECTION. In intrinsic semiconductors, the carrier concentration is related to the band gap [10] by equation (30). It is important for the carrier concentration to fall below the maximum carrier concentration or equivalently for the band gap to be above a minimum band gap (unlike in Skinner and Fu's patent in which the band gap must be below a maximum band gap). One can write equation (28) in terms of the thickness of the semiconductor layer:

$$\frac{\kappa \varepsilon_0}{q} \frac{E_y}{4\delta} < n < \frac{\kappa \varepsilon_0}{q} \frac{E_y}{1.5\delta} \quad (31)$$

Combining with equation (30) yields $$\frac{\kappa \varepsilon_0}{q} \frac{E_y}{4\delta} < \sqrt{N_c N_v} \exp\left(-\frac{E_G}{2k_B T}\right) < \frac{\kappa \varepsilon_0}{q} \frac{E_y}{1.5\delta} \quad (32)$$

or $$\ln\left(\frac{\sqrt{N_c N_v}}{\kappa \varepsilon_0} \frac{q\delta}{E_y}\right) + \ln(4) > \frac{E_G}{2k_B T} > \ln\left(\frac{\sqrt{N_c N_v}}{\kappa \varepsilon_0} \frac{q\delta}{E_y}\right) + \ln(1.5) \quad (33)$$

The minimum band gap required to keep the carrier concentration below the maximum carrier concentration, and keep the semiconductor in depletion mode is $E_{GMin}$ $$E_{GMinimum} = 2k_B T \ln\left(\frac{\sqrt{N_c N_v}}{\kappa \varepsilon_0} \frac{q\delta}{E_y}\right) \quad (34)$$

This is the minimum band gap needed for the depletion zone to be equal to the thickness of the semiconductor layer. At the lower limit in equation (32) and (33), a factor of 1.5 has been added to provide enough of a buffer for avoiding any part of the semiconductor layer to leave depletion mode. At the upper limit, a factor of 4 has been added to avoid a depletion zone with unnecessarily low carrier concentration that would adversely affect the performance of the device.

While equations (32) and (33) are the preferred guide for defining the band gap limits that a material should have, one can alternatively select a band gap greater than $k_BT$ to avoid taking the semiconductor out of depletion mode, where $k_B$ is Boltzmann constant and T is temperature.

FAVORING ONE TYPE OF CARRIER BY SELECTING MATERIAL MOBILITY. Mobility affects the speed and direction of the ExB drift. Particles drift with a speed which, in the limit of high mobility, approaches $$v_{ExB} = \frac{E_y}{B_z},$$

in an angular direction approaching the X axis. Those with low mobility tend, in the limit, to slowly drift along the Y axis, going down the potential energy gradient defined by the electric field and the charge of the particle, with a speed approaching zero. In any given material and temperature, electrons and holes generally have different mobilities. (Usually, electrons have a greater mobility than holes, but not always). For example, electrons in indium antimonide at 170K have a mobility of 19.8 m$^2$/V/s and holes, a mobility of 0.236 m$^2$/V/s. This property that can be used to advantage, to favor the ExB drift of one type of carrier over the other. As a result, their associated currents do not cancel out as in the ideal no-collision case, which results in a non-zero net current and a useful power output.

Materials of interest have a high mobility. They include but are not limited to indium antimonide (InSb), indium arsenide (InAs), indium phosphide (InP), gallium indium arsenide (GaInAs), and mercury cadmium telluride (HgCdTe), graphite, graphene, and diamond.

MOBILITY. The selection of semiconductor material should account for the mobility of the carriers, which should be neither too low nor too high. Too low a mobility is unfavorable as it causes the paths of the carriers to be interrupted before they can cover a significant portion of a cycloid, rendering the ExB drift impossible. Notably, too high a mobility is also unfavorable because it lowers the thermal coupling between the carriers and the semiconductor crystal lattice, thereby reducing the ability of the device to convert thermal energy to electricity. US patent application 20180026555 [1] (paragraph 37 line 2) and publication [2] does not teach that a moderate mobility can enhance the performance of the device. The next paragraph discusses optimization of mobility in the context of a magnetic field.

FAVORING CARRIERS USING THE PRODUCT OF MOBILITY AND THE MAGNETIC FIELD. The product of mobility and magnetic field $\mu B_z$ is a dimensionless number that provides a geometrical index tied to the power generation effectiveness of the ExB drift. It represents the angular displacement $\Delta\theta$ of a particle following a mean free path projected on the XY plane, $\lambda_{xy}$, around a cyclotron orbit (for a given magnetic field) of radius r. In other words, $\mu B_z = \Delta\theta = \lambda_{xy}/r$. When the product is $\pi$, the mean free path covers half a circumference of the orbit. It has been determined that for good power generation performance, this product should range from 1 to 10. Preferably, this product should range from 1 to 3. Even more preferably, this product should be approximately 2 which covers approximately one third of a cyclotron orbit. Since electrons and holes have different properties, one can select a product of magnetic field and mobility to favor electrons and disfavor holes, thereby enhancing electron current over hole current. If one restricts the magnetic field $B_z$ to below 1.5 Tesla which is achievable with permanent magnets and preferable for economic reasons, then one must use high mobility semiconductors. For example, at 170K, indium antimonide has a mobility of 19.77 m$^2$/V/s for electrons and 0.236 for holes. Using a magnetic field of 0.1011 Tesla, one can achieve a mobility-magnetic field product of 2 for electrons and 0.024 for holes, thereby vastly favoring electrons. Similarly, at 300K, indium arsenide has a mobility of 3.01 m$^2$/V/s for electrons and 0.0177 for holes. Selecting a magnetic field of 0.664 Tesla, results in a mobility-magnetic field product of 2 for electrons and 0.015 for holes, also vastly favoring electrons.

This design guideline is soft because it depends on the statistically distributed particle velocity, and it needs to be considered in light of other tradeoffs. For example, a slightly shorter uninterrupted orbit does not necessarily mean an abrupt cessation of functionality but a gradual decrease in performance.

Figure 2A:
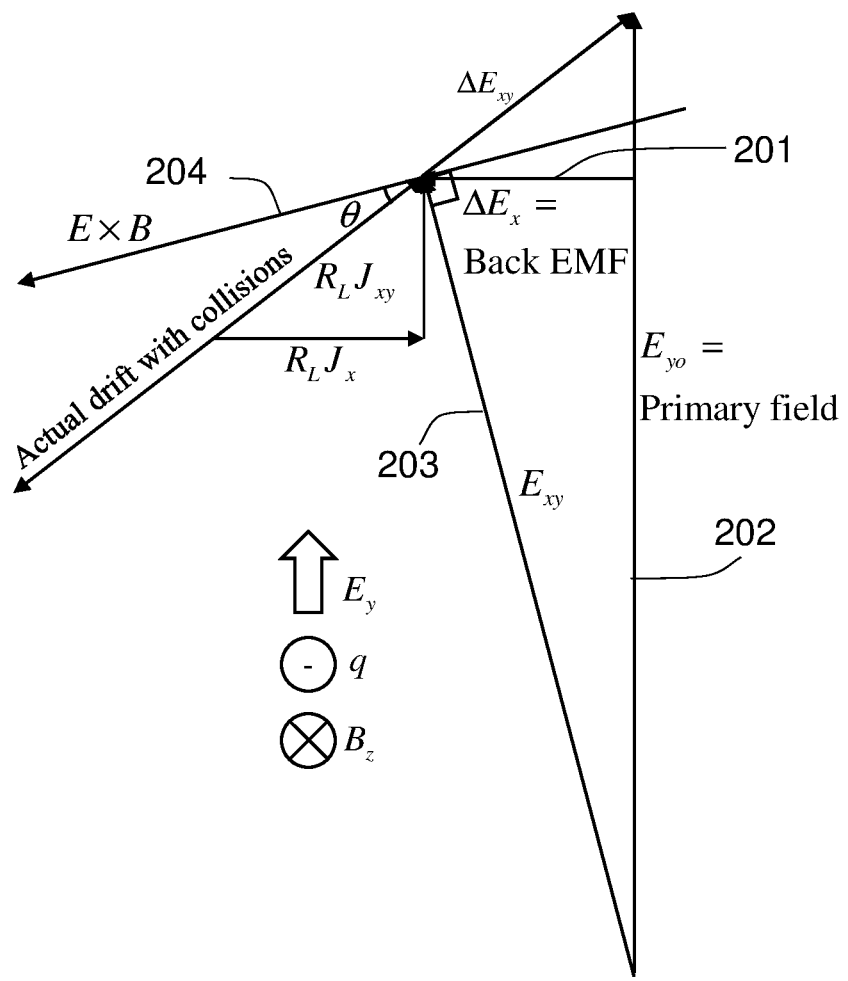
FIG. 2A shows a vector diagram in which the drift is modified both by finite mobility and by a back EMF caused by the accumulation of charges when a load is added, that draws a current $J_x$.

FAVORING CARRIERS BY POSITIONING ELECTRODES ACCORDING TO THE DRIFT ANGLE AND THE GEOMETRY OF THE SEMICONDUCTOR. Under ideal collision-less conditions, the output ExB drift current occurs along an axis perpendicular to the magnetic field and the electric field. However, under realistic conditions, the drift direction is deflected by two mechanisms as shown in FIG. 2A:
1. Opposition to current flow, for example by an external load, causes a build-up of space charges and a back EMF that results in an electric field component $\Delta E_x$ 201 that modifies the primary electric field vector $E_{yo}$ 202. Initially perpendicular to the semiconductor layer, the electric field is redirected to a new vector $E_{xy}$ 203 and the ExB drift 204 is redirected accordingly.
2. Collisions in the bulk of the material which causes the drift direction to shift from the ExB axis 204 by an angle $\theta = \tan^{-1}(1/\mu B_z)$ where $\mu$ is mobility and $B_z$ is the magnetic field. Those particles with the highest $\mu B_z$ tend, in the limit, to drift in a direction along the ExB axis independently of their charge. In the limit of very low $\mu B_z$ carriers drift down the potential energy gradient, up or down the $E_{xy}$ field, according to their charges.

Figure 3:
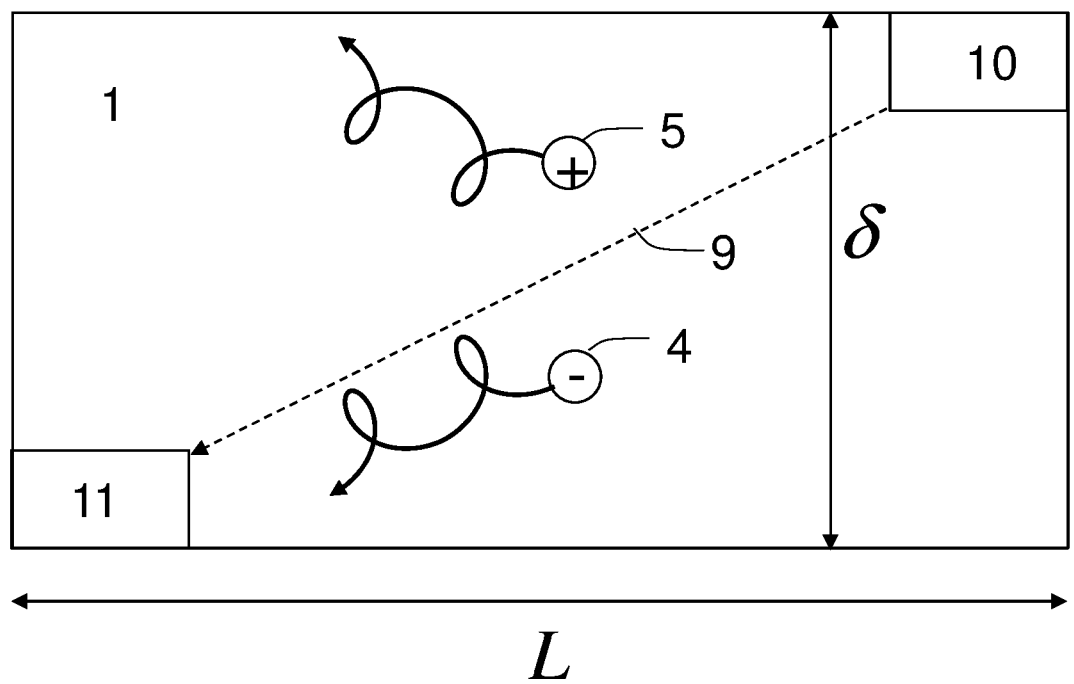
FIG. 3 illustrates how electrodes placed along an axis angularly closer to the drift angle of overriding carriers than to that of the overridden carriers, can capture more of the overriding carriers' current.

Since each type of carrier has a different mobility, and the magnetic field is identical for each, their drift direction is different as shown in FIG. 3. Electrodes 10 and 11 positioned in the semiconductor along an axis angularly closer to the electron drift axis 9 can capture more of the electron current 4. And vice-versa, if the electrodes were positioned on an axis angularly closer to the hole drift axis, they would capture more of the hole current 5.

To favor the overriding carriers i.e., those carriers with the largest current contribution, one can position electrodes along an axis close to their actual drift angle. Assuming a small back EMF and a negligible alteration of the electric field, and if $\mu$ is the mobility of the overriding carriers, then, as shown inn FIG. 2, their drift angle 8 is $\tan^{-1}(1/\mu B_z)$. As illustrated in FIG. 3, a semiconductor layer 1 can be designed with thickness $\delta$ along the Y axis, and a length L along the X axis such that $L = \mu B_z \delta$. For example, if the thickness is 1 micron, and $\mu B_z = 2$, then the length of the layer would be 2 microns. Two electrodes could then be positioned at diagonally opposite corners of the layer's XY cross section, the first on the top surface and the second, downstream from the first, on the bottom surface. The axis through the electrodes would then be collinear with the drift axis of the overriding carriers 4, allowing the electrodes 10 and 11 to capture the overriding current efficiently.

In the presence of an electrical load, space charges build up that cause a back EMF resulting in the alteration of the electric field and a redirection of the drift as already illustrated in FIG. 2A. To capture more of the ExB drift current, the angular relationship between the electrodes could be adjusted to account for a shift in the electric field, in other words, the electrodes should be positioned along the axis of the actual, not ideal, drift.

FAVORING CARRIERS USING THE SIZE OF THE CYCLOID PATHS AND THE THICKNESS OF THE SEMICONDUCTOR LAYER. The ExB drift can only occur if the carriers' path is not interrupted. Carriers can experience two types of interruptions:
1. Collisions within the bulk of the material. This type of interruption is quantified by mobility, and as already discussed, mobility can be used to favor one type of carrier (e.g., electrons) over the other (e.g., holes).
2. Collisions with surfaces, for example the surface of the semiconductor layer holding the carriers. This type of interruption can also be used to favor one type of carrier (e.g., electrons) over the other (e.g., holes) by adjusting the thickness of the layer, as shall be discussed in this section.

Figure 3A:
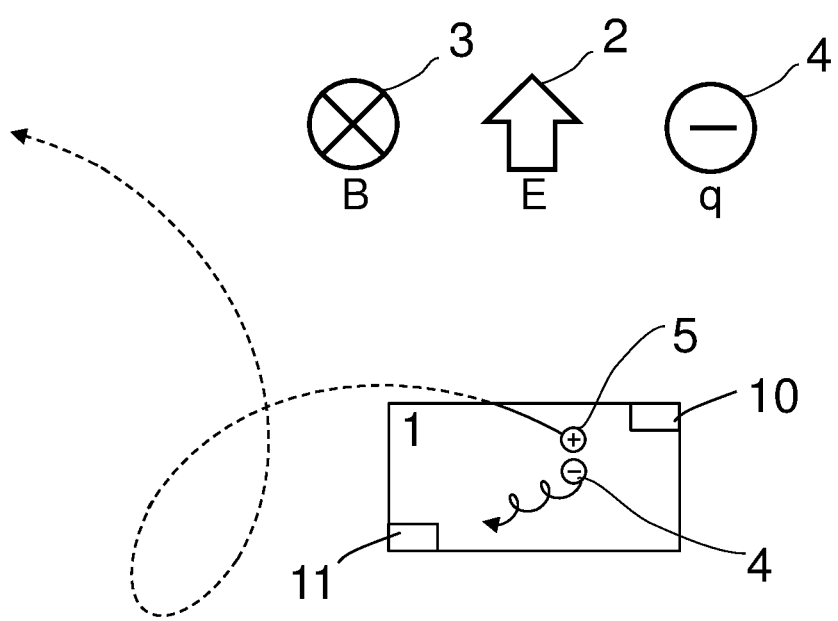
FIG. 3A shows how the thickness of a semiconductor layer can favor the drift of the overriding carriers but not that of the overridden carriers.

As shown in FIG. 3A, both electrons 4 and holes 5 follow cycloid paths in the XY plane (which is the plane of the paper in the figure). This plane is perpendicular to the magnetic field $B_z$ and parallel to the electric field $E_y$. The dimension of these paths projected on the Y axis is commensurate with cyclotron orbits that particles would follow in the applied magnetic field, and therefore dependent on the particles' effective mass. One must keep in mind that the size of these paths is probabilistic and must be viewed as an average, as it is determined in part by the velocity of the carriers, which is probabilistic. Therefore, for the ExB drift to remain uninterrupted, the semiconductor layer should be thicker than the average diameter of a cyclotron orbit. One can favor one type of carrier over the other by fabricating a semiconductor layer thick enough to contain the average cycloids for of one type of carrier (e.g. electrons, 4), but not for the other (e.g. holes, 5). For example, in InSb at 168K and in a magnetic field of 0.099 T electrons and holes respectively have orbital diameters of 0.961 microns and 5.421 microns. A semiconductor layer of 1.07 microns would better support the ExB drift of electrons than of holes. Similarly, in InAs at 300K, and with a magnetic field of 0.83 T, electrons and holes have respective diameters of 0.197 microns and 0.914 microns. A semiconductor layer 0.547 microns thick would support electrons better than holes. One should note that the velocities of electrons and holes are statistically distributed, and the orbital dimension referred to above are averages. Nevertheless, one can assert that on the average, electrons are favored over holes.

SOURCE FOR THE ELECTRIC FIELD. These sources of the electric field include insulated capacitor plates, ferroelectrics, electrets, surface doping, and junctions embedded in the bulk of the semiconductor material or configured on its surface. The junctions can be homojunctions or heterojunctions.

Figure 3B:
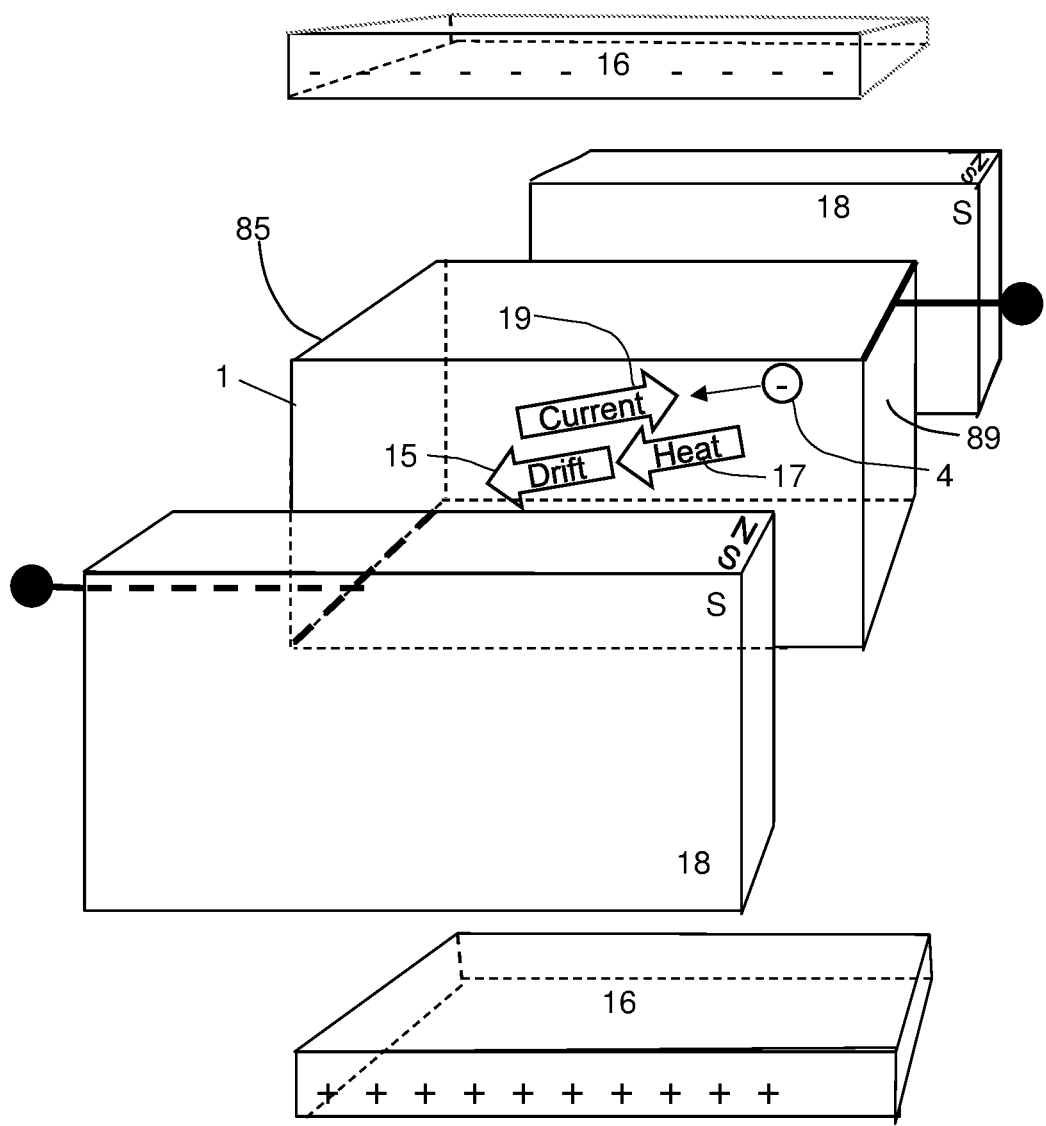
FIG. 3B shows the basic physical configuration that includes an electric field produced by capacitor plates, electrets, ferroelectrics or a junction, and a magnetic field can be produced by magnets or electromagnets.

FIG. 3B shows how an electric field can be produced across layer 1 by capacitor plates, electrets, or ferroelectrics 16, and a magnetic field can be produced by magnets or electromagnets 18. The drift 15 has a direction in accordance with the ExB drift effect, that depends on the direction of the fields, the mobility, and effective mass of the carriers 4 as illustrated in FIGS. 1-3A. The output current 19 flows in a direction opposite to the drift 15 if the charge of the carriers is negative. The heat 17 transported by the carriers 4 flows in the same direction as the drift 15.

One should note that the direction of this bulk current 19 is in a direction generally opposite to the surface current described in application Ser. No. 15/623,283 by the same inventor. This difference in output results in a difference in device configuration between this previous application and this invention. For example, differences in configuration include, but are not restricted to, the polarity of the positive and negative electrodes. In this application the polarity of the electrodes is being essentially determined by the direction of the ExB drift and charge of the carriers. In the previous application, it is in the opposite direction, determined by the surface current.

STACK CONFIGURATION The semiconductor layers can be arranged in a stack, the layers insulated from each other, except for electrode connections which could be serial or parallel. The layer could comprise identical semiconductor materials with the same overriding carriers, or, as an option, they could be interlaced with several different materials, such that adjacent layers in the stack would carry different overriding carriers, alternating between electrons and holes. If the layers are in a stack, the source of the electric field can be configured in a sandwich with each layer to produce a field essentially perpendicularly to the stack.

Figure 4:
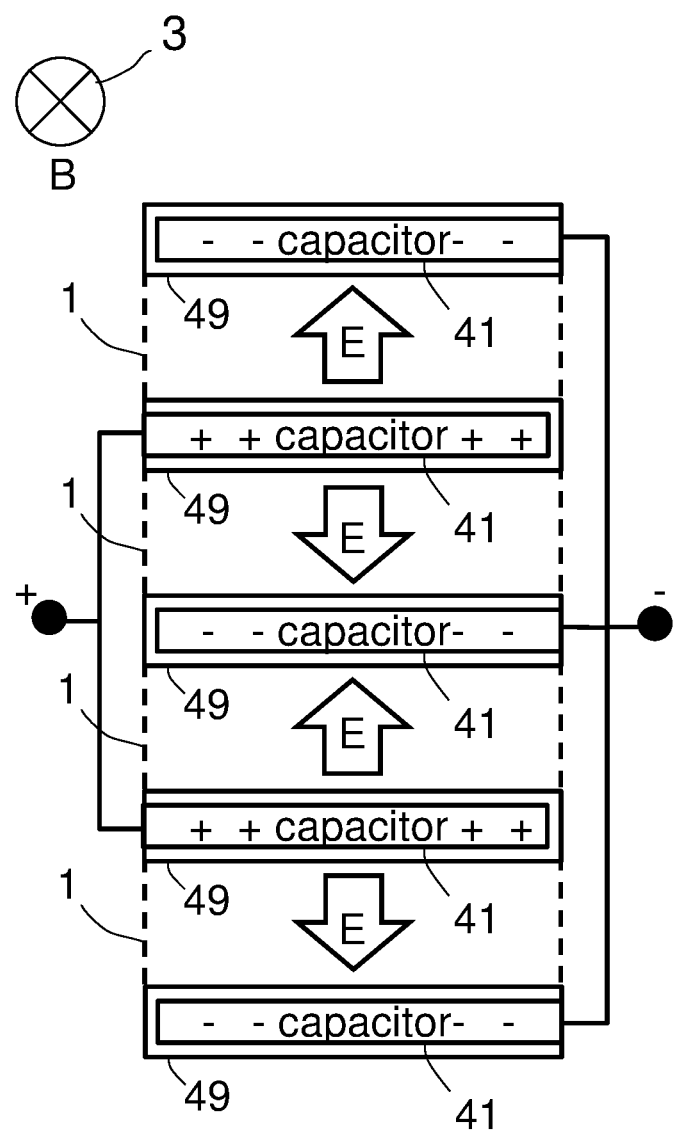
FIG. 4 shows a stack configuration in which the electric field is produced by insulated capacitor plates inserted between the semiconductor layers.

Several configurations can be used to produce this field. As shown in FIG. 4, insulated capacitor plates 41 covered with an insulating layer 49 can be inserted between the semiconductor layers 1 arranged in a stack. Assigning opposite polarity to alternating capacitor plates allows the plates inside the stack to serve double duty, that is, provide a field $E_y$ above and below itself in the stack. One advantage of the capacitor plate design is that the electric field can be adjusted and even reversed, thereby controlling the operation of the ExB drift, which may be useful for priming the device.

Figure 4A:
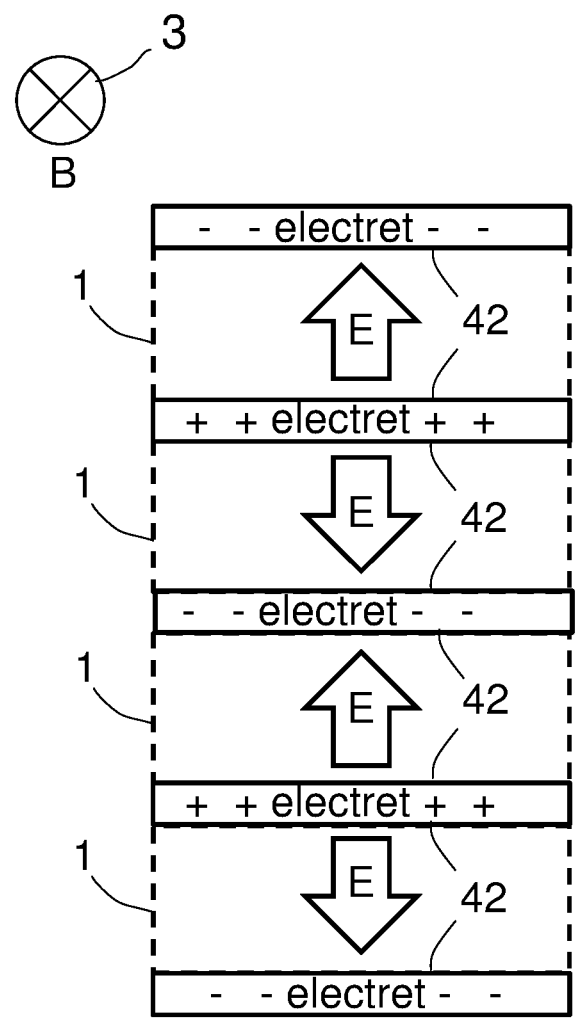
FIG. 4A shows a stack configuration in which the electric field is produced by electrets inserted between the semiconductor layers.

The electric field can also be produced by electrets as shown in FIG. 4A. The advantage of the electret design is that the charges are permanent and do not have to be actively maintained. The electret charges can be configured to alternate from one layer to the next, thereby allowing each electret to serve double duty by providing a field above and below itself in the stack. Ferroelectric materials can also be used in place of electrets.

Yet another approach for generating an electric field across the stack layers is to insert between the stack layers alternating materials with different work functions.

Yet another way of generating an electric field is by joining two different materials thereby forming a heterojunction.

Figure 4B:
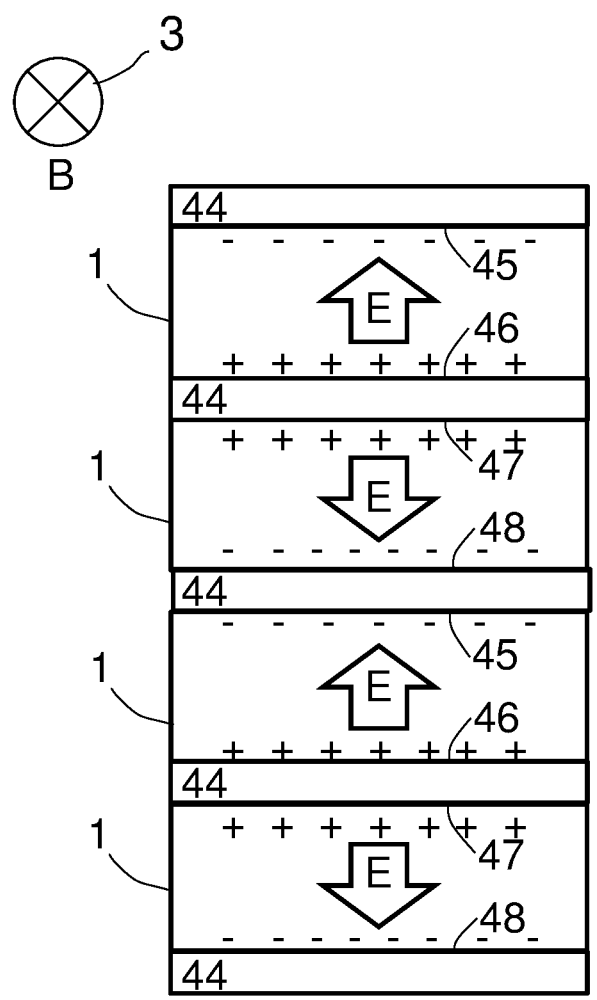
FIG. 4B shows a stack configuration in which the electric field is produced when both top and bottom surfaces of the semiconductor layers are doped.

Yet another method of producing an electric field across the stack layers is to use the built-in potential of a junction by applying a surface doping to each layer, thereby creating a junction at the surface, with the bulk of the layer operating mostly in depletion mode to prevent space charges from accumulating and canceling the electric field. FIG. 4B shows a configuration in which the layers are separated by an insulator 44. The surface doping is applied to the top and bottom surface of each layer, each layer of the stack alternatingly being n-doped/p-doped and p-doped/n-doped. In other words, a first layer is n-doped on the top surface 45 and p-doped on the bottom surface 46, and the layer below is p-doped on the top surface 47 and n-doped on the bottom surface 48. This arrangement ensures that the E field reinforces itself from one layer to the next. The bulk of the layer material could be intrinsic or lightly doped. The surface is significantly more heavily doped to ensure that an electric field is created by the built-in potential at the surface junction.

Clearly, a combination of the above electric field sources is possible, for example combining electrets with capacitor plates, to achieve charge permanence for operation yet flexibility, for example, for priming the device at the beginning of its operation.

Figure 4C:
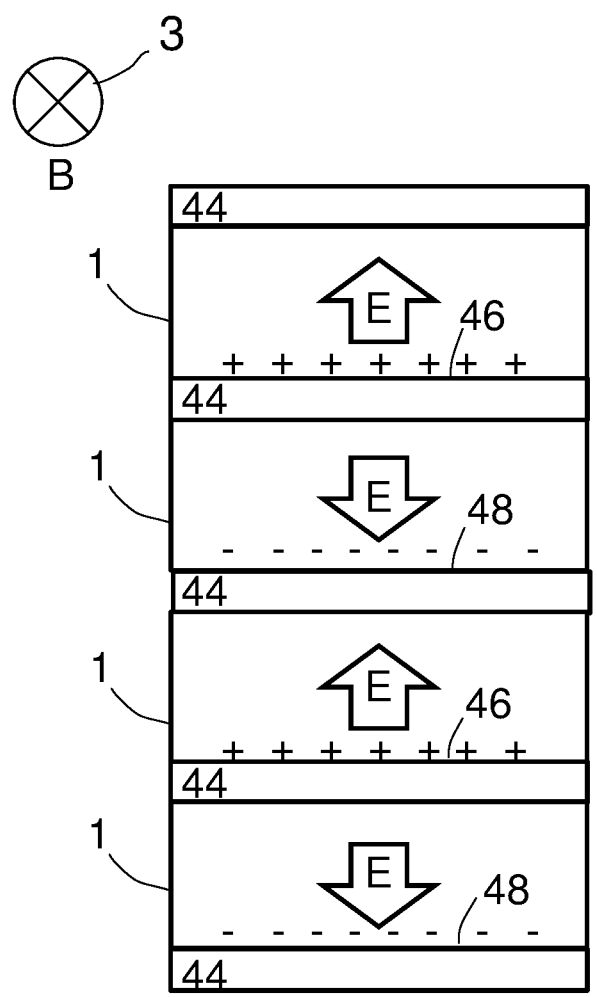
FIG. 4C shows a stack configuration in which the electric field is produced when only one of the surfaces of the semiconductor layers is doped.

In FIG. 4C the surface doping is applied to only one side of each layer. In this configuration, the polarity of the doping alternate from n-doped 48, to p-doped 46 such that the electric field produced by each doping is shared between two adjacent layers.

Figure 4D:
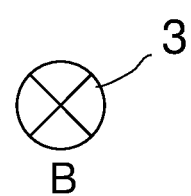
FIG. 4D shows a reticulated doped surface which has an anisotropic electrical conductivity, low along the X direction.
Figure 4D:
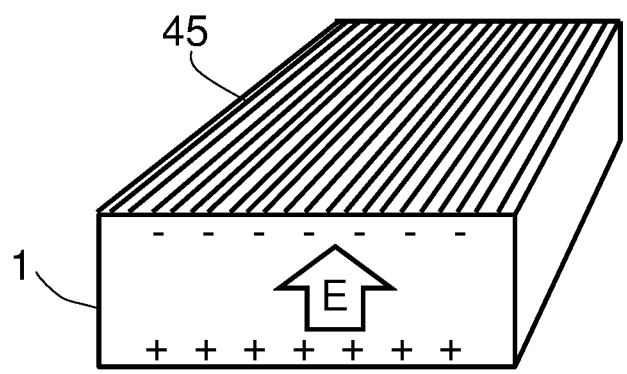

SURFACE RETICULATION FOR CONDUCTIVE ANISOTROPY. Doping the surface of a semiconductor layer can increase the conductivity of the layer and short circuit the desired power output. To avoid this problem, the surface can be made conductively anisotropic by reticulating or striating the doping in a direction perpendicular to the desired low conductivity axis (i.e., the X axis). In other words, the striation would be along the Z axis. FIG. 4D illustrates a reticulated or striated doping 45 in which the striations are in the Z direction designed to reduce the surface conductivity in the X direction. This technique prevents backward current leakage through the doped surface, in a direction opposite to the ExB drift current.

Figure 5:
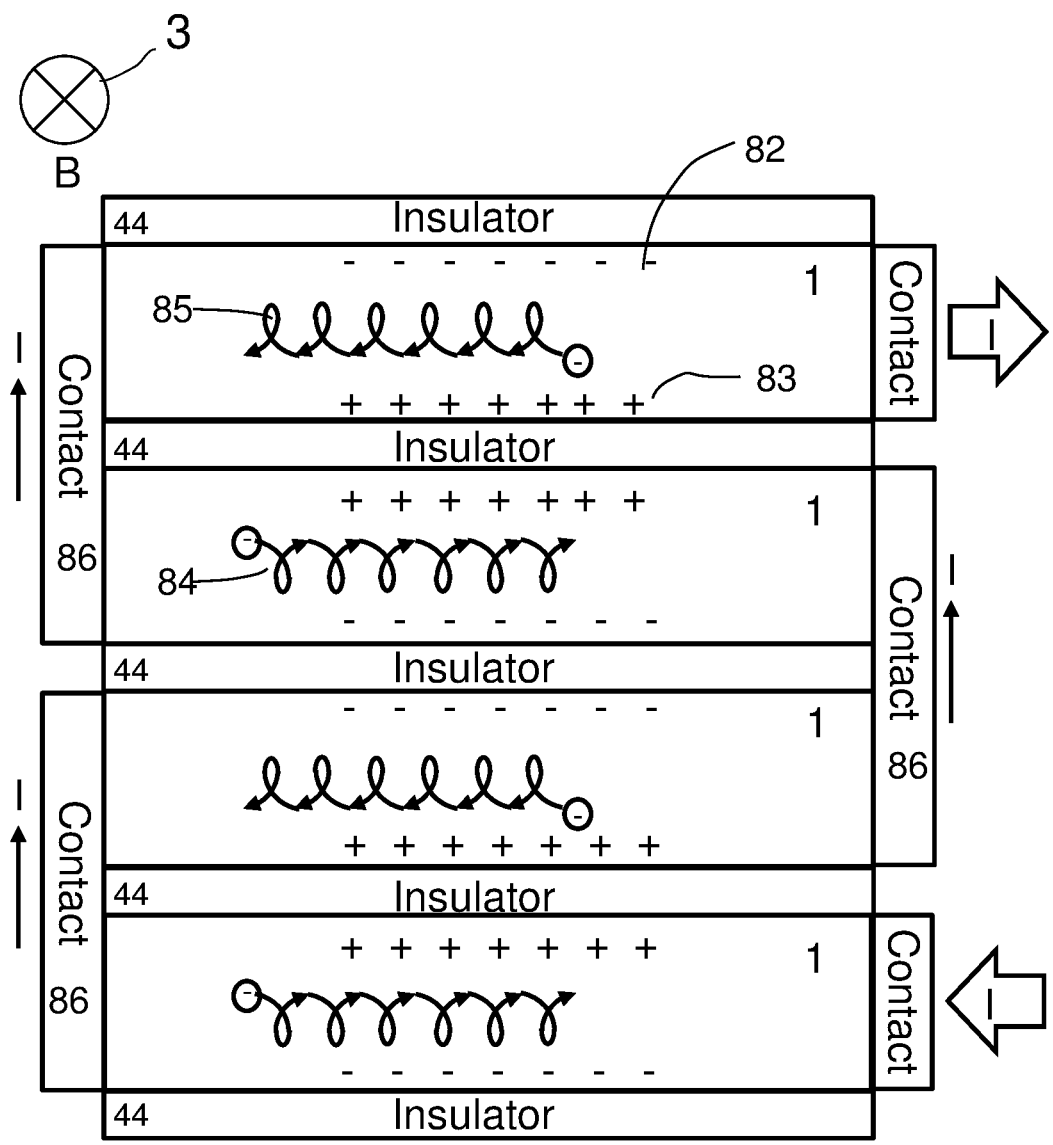
FIG. 5 illustrates a stack configuration in which the layers are connected in series.
Figure 5A:
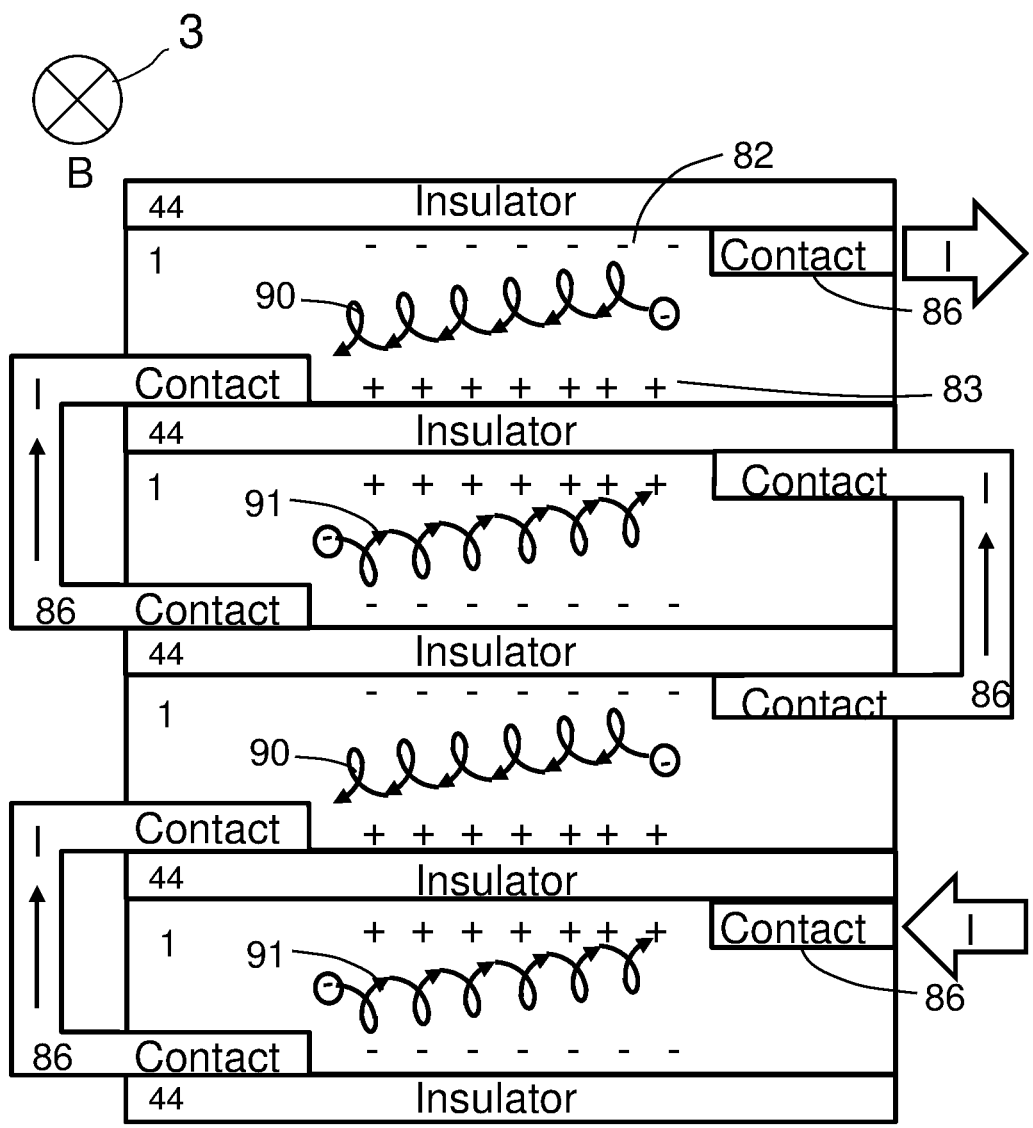
FIG. 5A illustrates a stack configuration in which the layers are connected in series, and electrodes are positioned along the drift axis of the overriding carriers.

The layers can be connected in series or parallel depending on how current is flowing in each layer. FIG. 5 illustrates a configuration in which the layers are connected in series. FIG. 5A illustrates another series configuration in which the electrodes are positioned close to the drift axis of the overriding carriers. A multiplicity of any of the configurations in FIG. 5 or 5A can also be connected in parallel.

Figure 6:
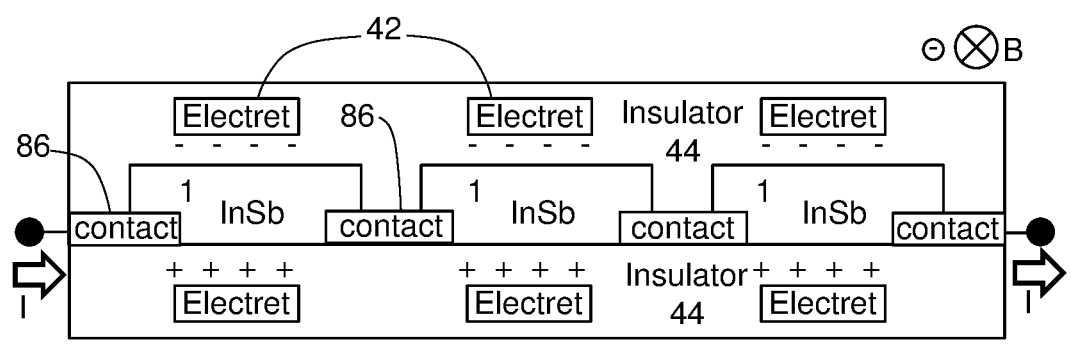
FIG. 6 illustrates a series configuration using electrets as the source of the electric field and indium antimonide as the semiconductor material. The electrodes capturing the current are located on the bottom surface of the semiconductor.

FIG. 6 illustrates a series configuration using electrets 42 as the source of the electric field and indium antimonide as the semiconductor material 1. The metal contact electrodes 86 are located on the bottom surface of the semiconductor.

Figure 6A:
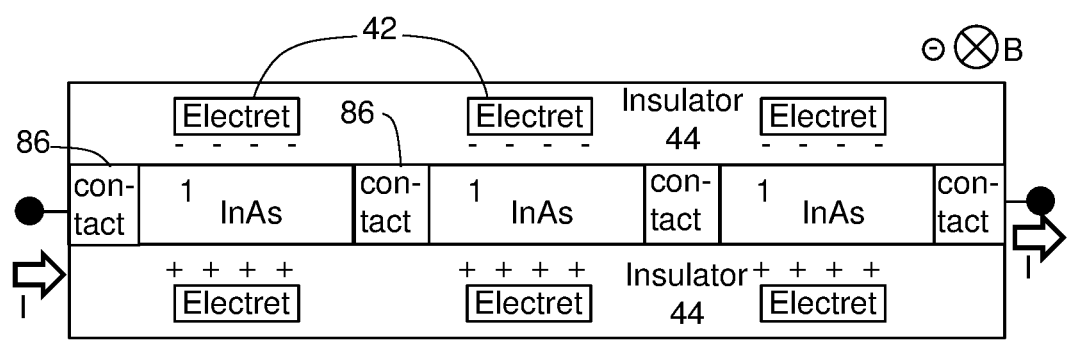
FIG. 6A illustrates a series configuration using electrets as the source of the electric field and indium antimonide as the semiconductor material. The electrodes are as thick as the semiconductor layer.

FIG. 6A illustrates a series configuration using electrets 42 as the source of the electric field and indium arsenide as the semiconductor material 1. The metal contact electrodes 86 are as thick as the semiconductor layer.

Figure 6B:
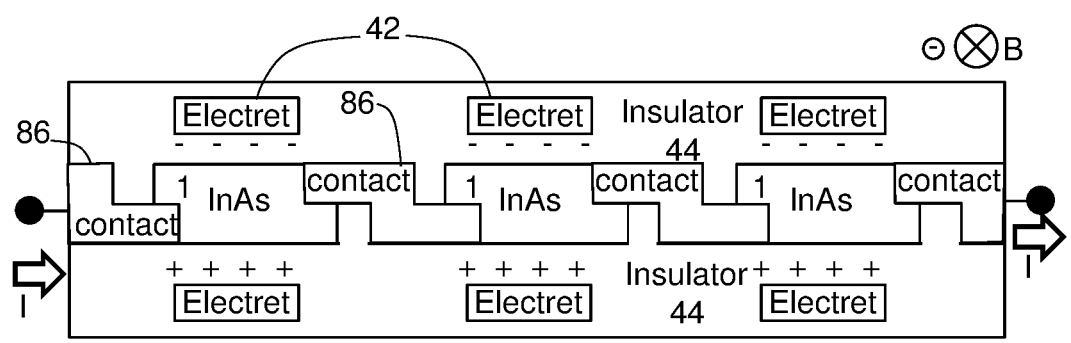
FIG. 6B illustrates a series configuration using electrets as the source of the electric field and indium antimonide as the semiconductor material. The electrodes are configured in a "Z-shape" to connect the current paths along the overriding drift axis.

FIG. 6B illustrates a series configuration using electrets 42 as the source of the electric field and indium arsenide as the semiconductor material 1. The metal contact electrodes 86 are configured in a "Z-shape" to connect the current paths along the overriding drift axis.

Figure 6C:
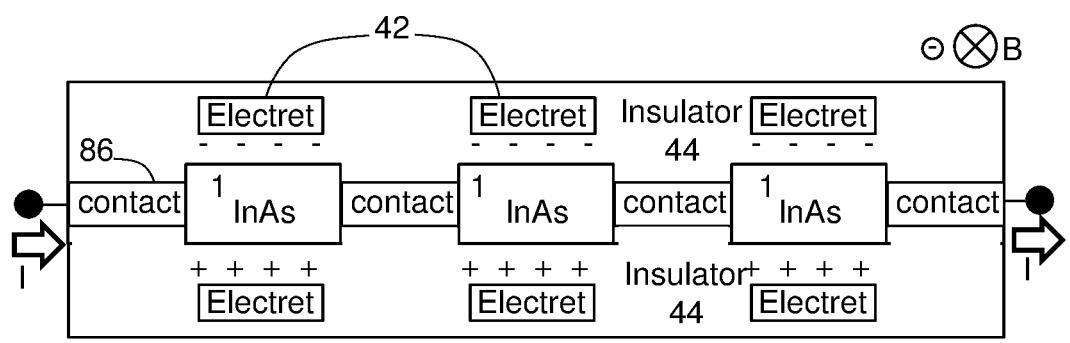
FIG. 6C illustrates a series configuration using electrets as the source of the electric field and indium antimonide as the semiconductor material. The electrodes are positioned along the central axis of the device.

FIG. 6C illustrates a series configuration using electrets 42 as the source of the electric field and indium arsenide as the semiconductor material 1. The metal contact electrodes 86 are positioned along the central axis of the device.

Figure 7:
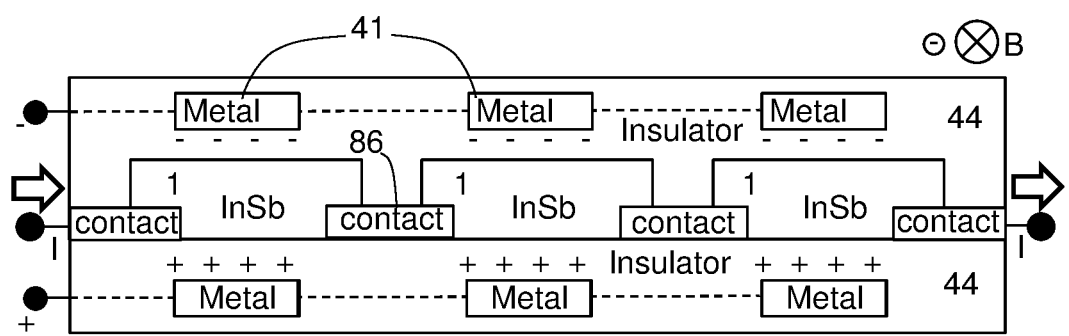
FIG. 7 illustrates a series configuration using capacitor plates as the source of the electric field and indium arsenide as the semiconductor material. The electrodes are located on the bottom surface of the semiconductor.

FIG. 7 illustrates a series configuration using capacitor plates 41 as the source of the electric field and indium arsenide as the semiconductor material 1. The metal contact electrodes 86 are located on the bottom surface of the semiconductor.

Figure 7A:
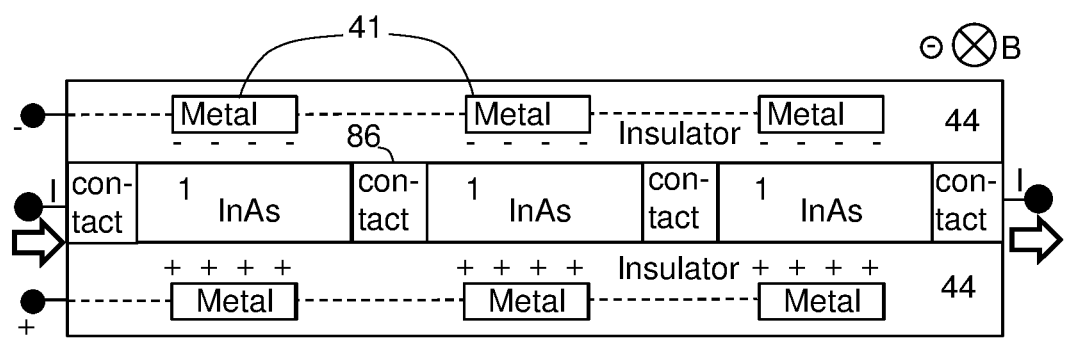
FIG. 7A illustrates a series configuration using capacitor plates as the source of the electric field and indium arsenide as the semiconductor material. The electrodes are as thick as the semiconductor layer.

FIG. 7A illustrates a series configuration using capacitor plates 41 as the source of the electric field and indium arsenide as the semiconductor material 1. The metal contact electrodes 86 are as thick as the semiconductor layer.

Figure 7B:
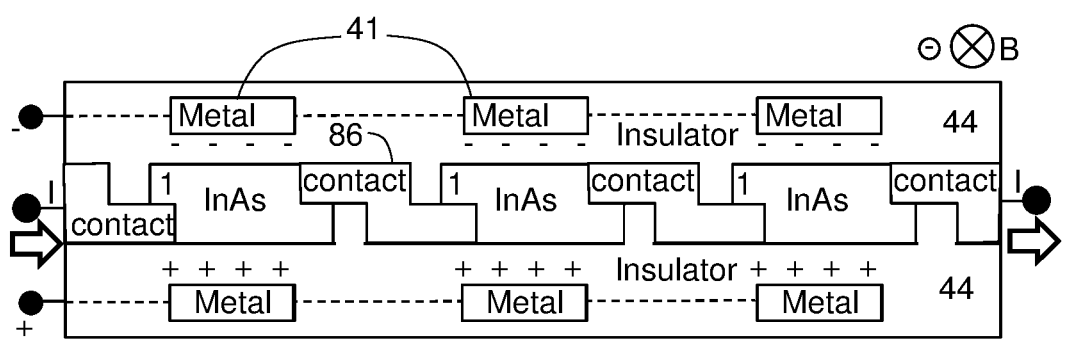
FIG. 7B illustrates a series configuration using capacitor plates as the source of the electric field and indium arsenide as the semiconductor material. The electrodes are configured in a "Z-shape" to connect the current paths along the overriding drift axis.

FIG. 7B illustrates a series configuration using capacitor plates 41 as the source of the electric field and indium arsenide as the semiconductor material 1. The metal contact electrodes 86 are configured in a "Z-shape" to connect the current paths along the overriding drift axis.

Figure 7C:
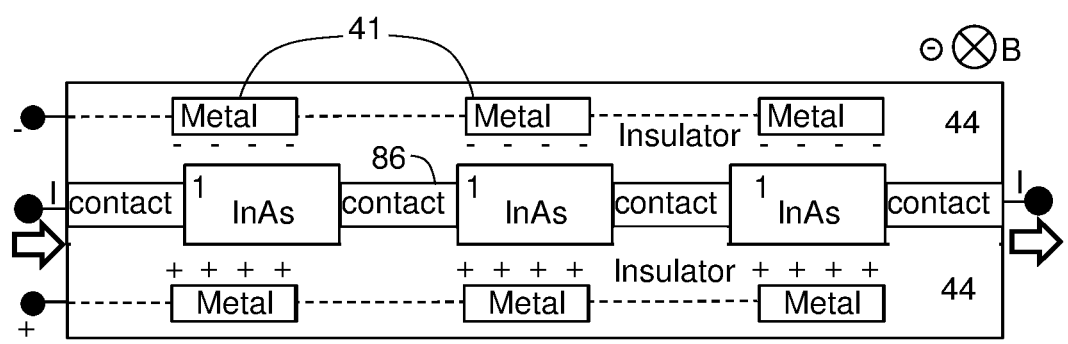
FIG. 7C illustrates a series configuration using capacitor plates as the source of the electric field and indium arsenide as the semiconductor material. The electrodes are positioned along the central axis of the device.

FIG. 7C illustrates a series configuration using capacitor plates 41 as the source of the electric field and indium arsenide as the semiconductor material 1. The metal contact electrodes 86 are positioned along the central axis of the device.

Figure 8:
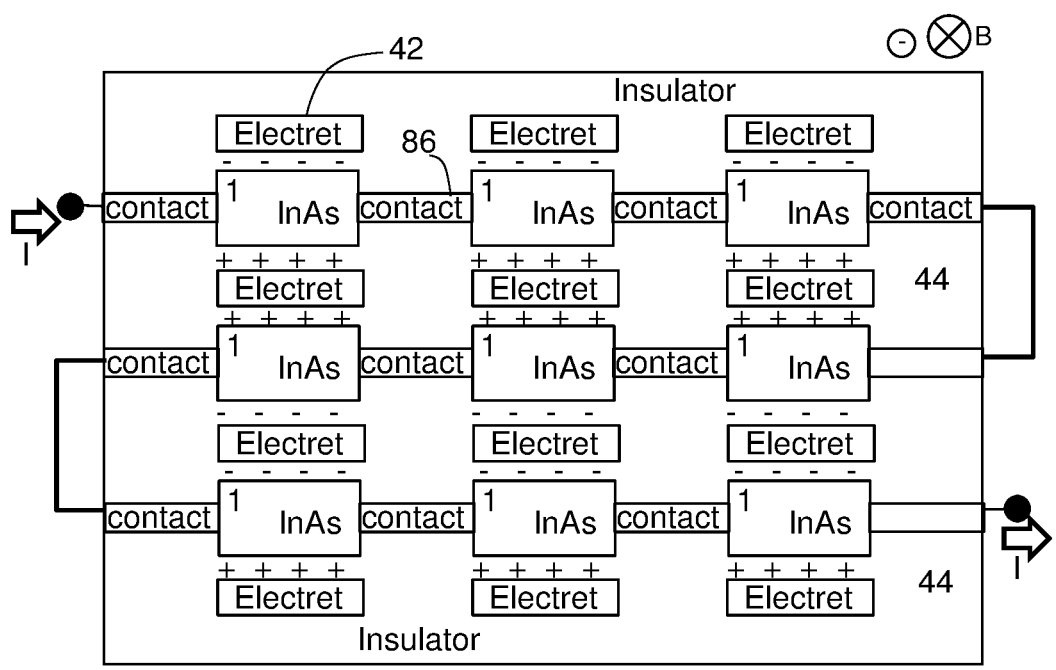
FIG. 8 illustrates a series and stack configuration using electrets as the source of the electric field and indium antimonide as the semiconductor material. The electrodes are positioned along the central axis of the device.

FIG. 8 illustrates a series and stack configuration using electrets 42 as the source of the electric field and indium antimonide as the semiconductor material 1. The metal contact electrodes 86 are positioned along the central axis of the device.

Figure 9:
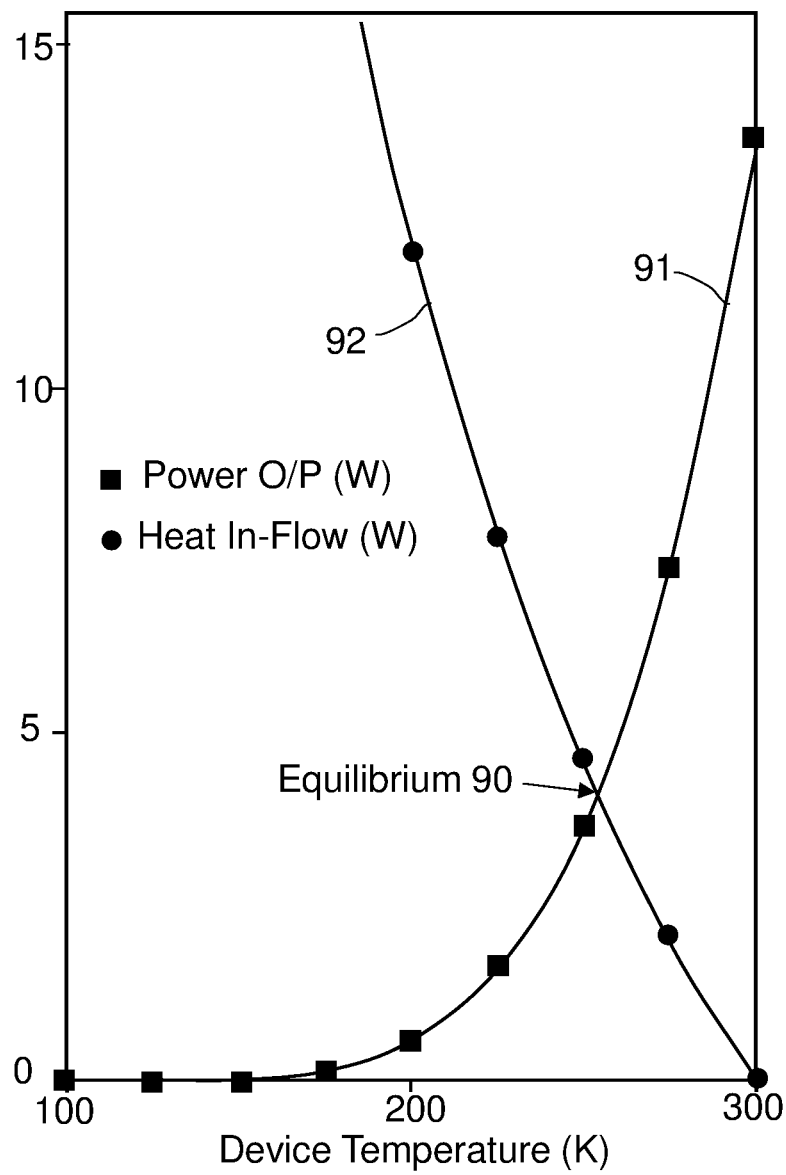
FIG. 9 shows how thermal equilibrium can be reached below 300K when the power output curve crosses the heat input curve.

FIG. 9 shows how thermal equilibrium 90 can be reached below 300K when the power output curve 91 crosses the heat input curve 92.

ALTERNATING LAYER POLARIZATION. The semiconductor layers can be arranged in a stack, each layer in the stack electrically insulated from each other (except for connections) and incorporating its own source of electric field. As shown in FIGS. 4, 4A, 4B, 4C, 5, 5A, and 8, the field within each layer can be made mutually reinforcing by stacking the layers such that their polarities alternate (upward/downward/upward/downward . . . ). This approach maximizes the electric field across each semiconductor layer and minimizing the electric field across the insulation layers.

SOURCE OF MAGNETIC FIELD. The magnetic field is configured to be parallel to the stack layers as shown in FIG. 1. The field can be produced by permanent magnets, electromagnets, or superconducting magnets. For economic reasons, one may choose to restrict the magnetic source to permanent magnets which have the clear advantage of low operating cost, low maintenance, and requiring no cooling and no continuous power input. Materials composing permanent magnets, include but are not limited to, neodymium iron boron alloys, iron nitride, samarium cobalt iron, copper zirconium alloys, strontium ferrite, aluminum, and iron and cobalt alloys (alnico). Neodymium magnets and iron nitride magnets are among the strongest. The source of the magnetic field can be positioned outside the semiconductor layer or be embedded inside the material or on its surface. The source of the magnetic field can also be built in the bulk of the semiconductor or on its surface.

CONFIGURING PERMANENT MAGNETS. Permanent magnets have an economical benefit, but their strength is limited to below about 1.5 Tesla. To maximize the power output, the product of mobility and the magnetic field $\mu B_z$ should be between 1 and 10, preferably between 1 and 3, even more preferably approximately 2. Therefore, a limit on the strength of the magnetic field restricts the mobility of the carriers, and the choice of materials and operating temperatures. It is important therefore to consider the following magnetic field focusing techniques.

Even though a single permanent magnet has a limited field strength, this field can be increased by combining magnets together, for example by means of two magnets in a N-S, N-S configuration with the semiconductor material in a sandwich between them, by using C-shaped or H-shaped magnets, by means of ferromagnetic material to create a magnetic circuit that focuses the magnetic field onto the semiconductor, or by using a combination of magnets configured as a Halbach array. The technology for focusing strong magnetic fields from permanent magnets is well known and can be found in the technical literature.

MATCHED LOAD. A load alters the operational characteristics of the device because the voltage across the load generates a back EMF along the X axis of the device. This back EMF attenuates and redirects the input field $E_{xy}$ as illustrated in FIG. 2A, which in turn, affects the ExB drift. Therefore, a matched load must be matched, not to the unloaded device, but to the ExB device in its loaded operating state.

OHMIC CONTACTS. Contacts with the semiconductor can also be designed to favor either holes or electrons. One can design contact to favor the overriding carriers to maximize the current output. As is well known, [11], there are two ways of making ohmic contacts:

1. For electron injection, choose metals of low work functions (below the work function of the semiconductor) for metal-n-type semiconductor junction or metal-intrinsic semiconductor junction. For hole injection choose metals with high work function (greater than the work function of the semiconductor) for metal-p-type semiconductor junctions. This lowers the potential barrier for efficient thermionic emission to make the free carrier density higher at the contact than that in the bulk of the semiconductor. The first approach is usually difficult because it is hard to find a suitable metal with the appropriate low work function to contact to n-type semiconductors, or large enough to contact to p-type semiconductors.

2. Dope the semiconductor surface heavily near the contact to make the potential barrier thin enough for efficient quantum-mechanical tunneling. A very thin layer is heavily doped with dopants by either diffusion or ion implantation techniques in order to make this layer become degenerate. Such a layer is called the $n^+$ layer for n-type semiconductors and the $p^+$ layer for p-type semiconductors. After this layer has been produced, any metal or alloy can be deposited on the surface of this layer to form a good ohmic contact. For example, the metal indium forms a good ohmic contact with InSb, InAs or HgCdTe. Let us take the ohmic contact for n-type semiconductors as an example. The $n^+$ layer provides a narrow barrier width for electrons to tunnel quantum-mechanically from the metal electrode to the conduction band of the semiconductor.

SELF-SUSTAINING OPERATION. Under normal operation, energy flows in and out of the device in the form of thermal and electrical energy. When its net power input is equal to its net power output, the device reaches temperature equilibrium which, obviously, is a self-sustaining state. Since heat must flow from the heat source into the device, the device must operate at a lower temperature than the heat source. The temperature of this self-sustaining state can be controlled by adjusting the thermal connection between the device and the heat source. A high thermal conductivity raises the temperature of the device toward the heat source, and vice versa a low thermal conductivity allows the temperature of the device to drop. The temperature of the self-sustaining state could also be controlled by adjusting how much power is drawn by the electrical load. Increasing the power drawn from the device lowers its temperature, and vice versa, drawing less power increases it. For example, the heat source could be at ambient temperature, (for example 300K) and the optimum operating temperature of the device could be below ambient, (for example at 273K). At the beginning of its operation, the device could be at ambient temperature, and would have to cool itself by outputting power to reach its optimum operational temperature.

PRIMING. A device optimized for a particular temperature may not begin its operation at that temperature, and therefore may not be capable, given its design parameters to reach its optimum operating state. It may be necessary to prime the device, that is to temporarily modify its design parameters at the beginning of operation to enable it to reach its optimum design temperature, thereby allowing it to achieve self-sustainability. Certain parameters such as the thickness of the semiconductor layer or doping which are set at fabrication time, cannot be easily altered at operation time. However, other parameters can be changed. These include:
1. The electric field,
2. The magnetic field,
3. The electrical load,
4. The thermal conductance linking the device to the heat source.

The electric field can be modified if it is produced by capacitor plates. The magnetic field can also be changed even if it is produced by a permanent magnet, by modifying the geometry of the device or by adding or subtracting from the primary (permanent magnet) field using an electromagnet for example.

Priming can also be achieved by changing the thermal conductivity of the connection to the heat source. An ExB drift device optimally designed, for example, for 200K and that begins its operation, for example at a heat source temperature of 300K, works sub-optimally at the higher temperature and may not be capable to cool itself sufficiently to reach its optimum working temperature. However, it may still produce some power. Decreasing the thermal conductivity to the heat source, reduces the input heat flow, thereby allowing the device to reach its design temperature, at which point the heat flow can be restored. A simple method of altering the thermal conductance between a heat source and the semiconductor is simply to connect or disconnect the thermal contact. In the case discussed above, the device would begin its operation at 300K with the thermal contact disconnected. The contact would then be reestablished when the temperature of the device reaches 200K.

Similarly, a device optimized for a high temperature but starting at a low temperature, can be primed by increasing the thermal connection with the heat source.

Priming can also be achieved by thermally connecting several ExB drift devices each optimized for a different temperature. For example, a first device could be optimized for the initial operating temperature and second, for the final steady-state operating temperature.

Yet another priming approach is to use a Seebeck device to bring the ExB drift device to its operational temperature.

Figure 10:
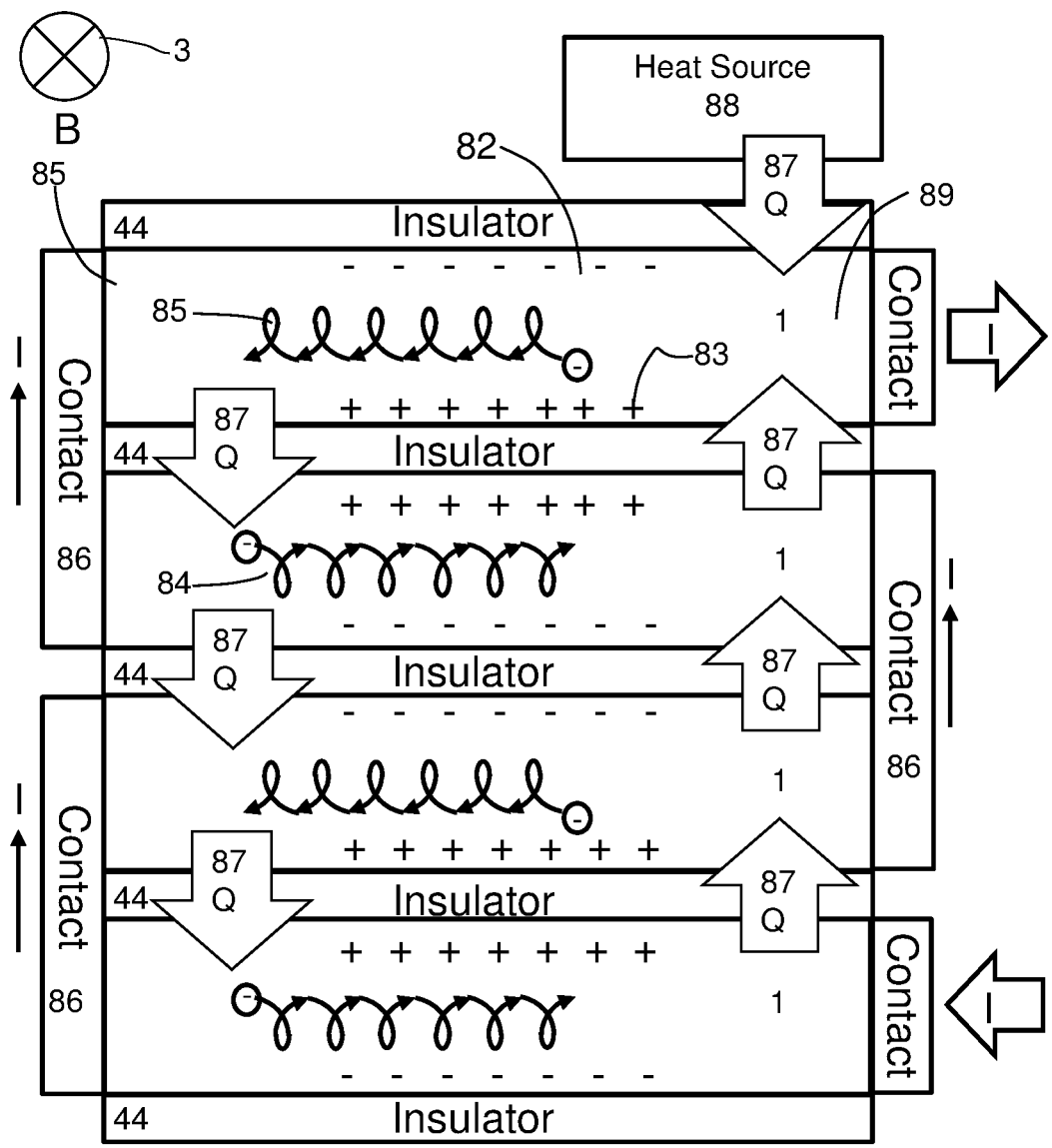
FIG. 10 illustrates how heat flow can be facilitated between the layers of a stack.

IMPROVING THERMAL FLOW. As shown in FIG. 3B, electrical carriers 4 carried by the ExB drift 15, transport heat phonons with them 17. In other words, the electrical drift is accompanied by an Onsager reciprocal thermal drift. This heat transfer causes a temperature difference in the semiconductor layer between the electrodes at each end of the semiconductor layer. This, known as the hot probe effect, causes the semiconductor layer to acquire a hot end 85 and a cold end 89. To facilitate heat transfer and improve performance, as shown in FIG. 10, the cold end 89 of the layer can be thermally connected to a heat source 88.

ENHANCING CARRIER FLOW BY SHORTING HEAT PHONONS. If one needs the device to drive a load and operate as an electrical generator, one needs to avoid any impediment to the flow of heat phonons. If a heat source 88 is not available, one can thermally connect the hot end 85 of the layer to its cold end 89. If multiple layers are present, one can thermally connect the cold end 89 of one to the hot end 85 of another. This can easily be done in a stack or ring configuration. FIG. 10 shows a stack configuration in which heat Q 87 flows across the insulator layers 44 separating the semiconductor layers 1.

ENHANCING HEAT FLOW BY SHORTING ELECTRICAL CARRIERS. Conversely, one may wish to use the device as a thermal generator. In this case, one needs to avoid any impediment to the flow of electrical carriers. The voltage across the electrodes can be minimized by electrically shorting them. Thermally connecting the cold end 89 of the semiconductor layer to a heat bath will leave the hot end 85 available as a heat supply hotter than the heat bath.

NO NEED FOR HEAT SINK. Heat engines as envisioned by Carnot have an upper efficiency limit known as the Carnot efficiency which is expressed as $$\eta_{Carnot} = \frac{T_H - T_C}{T_H} \tag{35}$$

where $T_H$ is the temperature of the heat source and $T_C$ is the temperature of the heat sink. In such a situation, the actual efficiency is $$\eta_{Actual} = \frac{Q_H - Q_C}{Q_H} = \frac{W}{Q_H} \leq \eta_{Carnot} \tag{36}$$

where $Q_H$ is the heat input from the heat source, $Q_C$ is the heat output to the heat sink, and $W=Q_H-Q_C$ is the useful work produced by the device.

Actual efficiency can equal Carnot efficiency in a reversible process, only possible in the limit when the speed of operation becomes infinitely slow and the power production of the device falls to zero. Reversibility requires time symmetry. In other words, the paths of particles going forward in time should be indistinguishable from the paths going backward in time. When time symmetry is broken, which can happen in the presence of a magnetic field, a reversible process is not possible even in principle. As Levy and Onsager [6,8,9] have noted, in such an environment, the forward-time paths and the backward-time paths are not identical, and reversibility is impossible. This effect becomes significant at scale commensurate with the diameter of a cyclotron orbit, which, for an electron in a field of 1 Tesla, can be macroscopic. Remarkably, as Benenti et al. [12] have shown, a magnetic field environment allows non-zero power production with actual efficiency equal to Carnot efficiency.

$$\eta_{Actual} = \eta_{Carnot} \tag{37}$$

Their paper (Benenti, G.; Saito, K.; Casati, G.; Thermodynamic Bounds on Efficiency for Systems with Broken Time-reversal Symmetry; arXiv:1102.4735v2 [cond-mat. stat-mech] 20 Nov. 2011. Also, in Phys. Rev. Lett. 106, 230602 (2011)) is hereby incorporated by reference. This finding is supported by ExB simulation, and by plasma experiments by Motley [13] and Rynn et al., [14] which showed spontaneous voltages generation.

Consider an ExB device (comprising a magnetic field) operating with the highest possible efficiency permitted by physical laws (i.e., the Carnot limit), as indicated in equation (37). Furthermore, let the heat source be at $T_H$=ambient temperature and the heat sink at $T_C$=0° K. While a temperature of 0° K is physically impossible to achieve, the analysis below demonstrates that this requirement can be jettisoned as it is actually not needed. Thus the efficiency of the device with a magnetic field and operating between $T_H$ and $T_C$=0 is:

$$\eta_{Actual} = \eta_{Carnot} = \frac{T_H - 0}{T_H} = 1 \tag{38}$$

which implies that.

$$\eta_{Actual} = \frac{W}{Q_H} = 1 \qquad (39)$$

further implying that the heat dumped to the heat sink is zero.

$$Q_C=0 \qquad (40)$$

Since the waste heat is zero, there is no need for a heat sink in the first place, and the questionable temperature $T_C=0°$ K becomes irrelevant. Therefore, the physical laws are upheld in that the device operates at the Carnot efficiency limit, which is maximized to 1, i.e., $\eta_{Actual}=\eta_{Carnot}=1$, and the work produced by the device is equal to the input heat. i.e., $W=Q_H$. No heat sink is necessary. This invention does not require a temperature difference between a heat source and a heat sink to produce an output current. One single temperature at the heat source is sufficient. In contrast, conventional thermoelectric devices relying on a temperature difference and the associated Seebeck effect. For example, Skinner and Fu (U.S. patent Ser. No. 10/439,123) relies on a temperature difference (Col 1, line 37, and Col 7, line 45) and on the Seebeck effect (Col 1, line 36; Col 3, lines 15-28; Col 6, lines 36-56; and Col 7, lines 1-10).

In summary, the extraordinarily high performance of the ExB thermoelectric effect may be explained as follows. Thermodynamics strictly requires that a device's efficiency be limited by the temperature difference between its heat source and its heat sink. The ExB drift operates as if the heat sink was at zero degrees Kelvin, which allows a 100% efficiency. Since all the input heat is converted to electrical energy, there is no leftover output heat. Therefore, the heat sink becomes redundant or virtual and its temperature, initially assumed to be zero Kelvin, becomes irrelevant. The system uses a single temperature at the heat source and operates at the limit of what is thermodynamically possible, without violating the second law as expressed by the Carnot efficiency limit. This capability is due to the magnetic field which allows actual efficiency to equal Carnot efficiency.

NO NEED FOR A TEMPERATURE GRADIENT. Of course, a heat source is necessary, and the device must operate at a temperature lower than the heat source to enable heat to flow into the device. However, the temperature difference between the heat source and the device can be made arbitrarily small by increasing the heat conductivity between them. This temperature difference has nothing to do with the temperature difference between the heat source and the heat sink as specified by Carnot in equation (35). This invention does not require a heat sink. Therefore, there is no need for temperature gradient between a heat source and a heat sink in the sense commonly understood by a person having ordinary skill in the art of thermoelectrics. In contrast, the invention described in US Application 20180026555 [1] by the same inventor does not dispel the conventional understanding by such a person, that both a heat source and a heat sink are needed.

INCREASE IN ENERGY PRODUCTION WITH TEMPERATURE. As explained above, a heat sink is not necessary which implies that the device can operate using ambient heat as a heat source. However, since power output increases with increased input temperature, a heat source above ambient, if available, can advantageously be used to improve the performance of the device.

RELIANCE ON SUBTRACTIVE CONTRIBUTION OF ELECTRON AND HOLES. This invention relies on differences between carriers' properties such as mobility and mass to accentuate the differences in their ExB behavior. Whereas other inventions such as the one by Skinner and Fu (U.S. Pat. No. 10,439,123 Col 3 line 46) need electrons and holes to contribute additively to the thermal effect of their device, this invention requires carriers to contribute subtractively to the output current. Therefore, to maximize this current, one needs to configure the device such as to increase the contribution of one type of carriers and decrease the contribution of the other type. (Typically, but not always, electrons are the overriding carriers and their contribution should be increased and that of holes, decreased).

SUBSTRATE. Ideally the substrate onto which the semiconductor is fabricated should not cause any local disruption in the crystal structure of the semiconductor, which would result in variation in mobility within the bulk of the semiconductor. Furthermore, the substrate should be an insulator to prevent short-circuiting the device. The choice, of material for the substrate is therefore important. For example, if the semiconductor is Indium Arsenide which has a lattice constant of 6.058 A, a good insulating substrate would be Indium Phosphide [15-23] which has a lattice constant of 5.869 A. The Indium Phosphide could be made to behave as a semi-insulator by doping it with iron as described by Heremans [22,23] and by Rumsby et al [24] or with cobalt as suggested by Hess et al. [19]. The InP material can be fabricated using Metal Organic Chemical Vapor Deposition (MOCVD) [19]. For a donor concentration of less than $5 \times 10^{16}$ per $cm^3$, the iron doping yields semi-insulating material with a resistivity greater than $10^7$ ohm-cm [24]. When the device is constructed in a stack as shown in FIGS. 4-4C, FIGS. 5-8 and FIG. 10, the semi-insulator substrate can serve as insulating material 44 between layers of semiconductor material 1.

OUTPUT IS CURRENT, VOLTAGE AND POWER. The ExB device described in this invention does not simply produce a voltage or an electric field. It generates a voltage accompanied by a current. In other words, it produces power which can be utilized by connecting an electrical load across the device. This distinction is important because many natural phenomena do exhibit fields but are incapable of generating power. For example, the built-in potential and an electric field existing within in a semiconductor diode junction cannot be used to generate power because voltages across the contacts between the semiconductor and leads connected to it, exactly cancel the built-in potential. Similarly, work functions or surface potentials cannot produce power.

RANGE OF OPERATING TEMPERATURE. The physical principles supporting the ExB drift remain valid over a wide range of operating temperatures which can be below ambient (e.g., 150° K to 300° K or even from 1° K to 300° K) as well as above ambient (e.g., greater than 300° K.). The absence of a heat sink requirement implies that any heat source can be used, including ambient heat.

MATERIALS. Media capable of supporting the ExB drift include semiconductors, preferably with a relatively high mobility to satisfy an acceptable product of mobility and magnetic field $\mu B_z$, preferable between 1 and 10, more preferably between 1 and 3, and even more preferably about 2.), superconductors, and plasmas.

GENERATION OF A TEMPERATURE GRADIENT WITHIN SEMICONDUCTOR. The ExB drift can also be used to produce a temperature gradient. When electrodes are shorted together, electrical carriers circulate through the semiconductor, unimpeded to transport heat as they drift in the material. Heat is also transported by phonons internal to the material. The electron thermal flow, the hole thermal flow, and the internal phonon thermal flow combine to result in a net thermal flow that can be used outside of the semiconductor. To facilitate heat transfer and improve performance, as shown in FIG. 10, the cold end 89 of the layer can be thermally connected to a heat source 88. One should note that since no heat sink is required, this temperature gradient is not between a hear sink and a heat source but between two ends of the semiconductor layer, a cold end 89 and a hot end 85. If the cold end 89 is thermally connected to, (and is essentially at the same temperature as) the heat source 88, then the hot end 85 becomes warmer than the heat source 88.

DOPING. The semiconductor must remain in depletion mode, to prevent the complete cancellation of the electric field by space charges. A region of the semiconductor without an ExB drift but loaded with carriers would short circuit the device, preventing its operation. The semiconductor can be left intrinsic. Doping can be beneficial as it increases the number of carrier, thereby improving the performance of the device, but to a point. Doping becomes detrimental when the carrier concentration becomes so high that the semiconductor layer ceases to be wholly in depletion mode, resulting in the cancellation of the electric field, and cessation of the ExB drift. In other words, maximum doping corresponds to the maximum carrier concentration expressed in equation (29). If doping is applied, it needs to be done judiciously to keep the semiconductor in depletion mode.

DEVIATION FROM IDEAL EXB DRIFT. Under ideal collisionless conditions, the ExB drift is perpendicular to the electric field $E_y$ and the magnetic field $B_z$ as described by equation (1). However, when mobility is finite, the drift is altered in direction and magnitude as described by equation (23). If a load is added, which presents an impediment to the free movement of carriers, space charges accumulate that produce an electric field component $\Delta E_x$ that modifies and redirects the primary electric field $\Delta E_{yo}$ resulting in the field $E_{xy}$ as shown in FIG. 2A. The ideal collisionless ExB drift remains perpendicular to $E_{xy}$ and $B_z$ and, therefore, is redirected accordingly. In real situations, collisions cause carriers to acquire an additional drift component along the electric potential gradient according to their charges, which results in a further redirection of the drift as shown in FIG. 2A. This second redirection depends on the mobility of the carriers and, therefore, is different for electrons and holes.

GUIDELINES ARE MEANT TO BE SOFT. This specification provides guidelines regarding the thickness and length of the semiconductor layer, the concentration level of carriers, the strength of the electric field and the magnetic field, and the electrical load. These guidelines are meant to be soft in part because they are based on statistical quantities such as the velocity of the carriers. For example, the depletion zone which has been approximated by a step function is in fact a smooth function. A violation of these guidelines does not result in sudden breakdown of operation but is a slow degradation of performance. These guidelines should be viewed as tradeoffs in a constrained optimization process.

APPLICATIONS. This technology can be used in applications such as heating, cooling, electrical energy production and lighting. Power supplies and coolers can be fabricated as integral subcomponents of semiconductor chips or modules.

TERMINOLOGY. Those carriers which contribute the greatest current are called overriding carriers in this invention. Their properties such as effective mass, velocity, charge, are called overriding properties. Conversely, those carriers which contribute the smallest current are called overridden carriers and their properties are called overridden properties. Usually (but not always), electrons are the overriding carriers and holes the overridden ones.

While the above description contains many specificities, the reader should not construe these as limitations on the scope of the invention, but merely as exemplifications of preferred embodiments thereof. Those skilled in the art will envision many other possible variations within its scope. Accordingly, the reader is requested to determine the scope of the invention by the appended claims and their legal equivalents, and not by the examples which have been given.

REFERENCES

1. Levy. G. S., Reciprocal Hall Effect Energy Generation Device, U.S. patent Ser. No. 15/623,283, publication 20180026555.
2. Levy, G. *The Open Science Journal of Modern Physics*, Vol. 4, No. 1, January 2017, pp. 1-8.
3. Skinner, B.; Fu, L.; Apparatus, systems, and methods for generating thermopower U.S. Pat. No. 10,439,123.
4. Skinner, B.; Fu, L.; Large, nonsaturating thermopower in a quantizing magnetic field; arXiv.org>cond-mat>arXiv: 1706.06117.
5. Guiding Center, Wikipedia.
6. Levy, G. S., *Journal of Applied Mathematics and Physics*, Vol. 7 No. 12, December 2019, pp 3140-3175.
7. Drude Model, Wikipedia.
8. Onsager, L. (1931) Reciprocal Relationships in Irreversible Processes. I.
Physical Review Journals Archive, 37, 407-425.
9. Onsager, L. (1931) Reciprocal Relationships in Irreversible Processes. II. Physical Review Journals Archive, 38, 2265.
10. Van Zeghbroeck, B. *Principle of Semiconductor Devices*, 2011. Online Book.
11. Kwan Chi Kao, Article I. Charge Carrier Injection from Electrical Contacts, Dielectric Phenomena in Solids, 2004.
12. Benenti, G.; Saito, K.; Casati, G.; Thermodynamic Bounds on Efficiency for Systems with Broken Time-reversal Symmetry; arXiv:1102.4735v2 [cond-mat.stat-mech] 20 Nov. 2011. Also, in Phys. Rev. Lett. 106, 230602 (2011).
13. Motley, R. W. (1975) Q-Machines. Academic Press, New York.
14. Rynn, N. and D'Angelo, N. (1960) Device for Generating a Low Temperature, Highly Ionized Cesium Plasma. Review of Scientific Instruments, 31, 1326. https://doi.org/10.1063/1.1716884
15. Yang; J. J.; Ruth, R. P; Manasevit, H. M.; Electrical properties of epitaxial indium phosphide films grown by metalorganic chemical vapor deposition, *Journal of Applied Physics* 52, 6729 (1981); https://doi.org/10.1063/1.328624.
16. Debney, B. T.; Jay, P. R.; Electron Mobility Calculations for Fe-Doped InP, *Semi-Insulating III-V Materials*, Springer, pp 305-312.
17. Nida, S.; Hinkov, B.; Gini, E.; Faist, J.; Characterization of iron doped indium phosphide as a current blocking layer in buried heterostructure quantum cascade lasers, *Journal of Applied Physics* 121, 094502 (2017).
18. Basu et al. Device isolation for III-V Substrates, U.S. Pat. No. 10,367,065.
19. Hess, K. L.; Zehr, S. W. Semi-insulating cobalt doped indium phosphide grown by MOCVD. U.S. Pat. No. 5,045,496A.
20. Johnston, Jr. W. D. Long, J., A.; MOCVD of semi-insulating indium phosphide-based compositions U.S. Pat. No. 4,716,130A.
21. Wu, C. C.; Feng, M. S.; Lin, K. C.; Chan, S, H; Chang, C. Y. Semi-insulating iron-doped indium phosphide grown by low-pressure metal-organic chemical vapour deposition, *Journal of Materials Science. Materials in Electronics*, volume 4, pages 62-66 (1993).
22. Heremans, J. P et al.; Method of making indium arsenide magnetoresistor; U.S. Pat. No. 5,117,543.
23. Heremans, J. P., et al; Solid State Magnetic Field Sensors and Applications; December 1998, *Journal of Physics D Applied Physics;* 26(8):1149.
24. Rumsby, D.; Ware, R.; Wittaker, M.; The Growth and Properties of Large Semi-insulating Crystals of Indium Phosphide, *Semi-Insulating III-V Materials*, pp 59-67, G. J. Rees Editor, Nottingham, 1980.
25. Wikipedia Mercury cadmium telluride.
26. Easley, J, Arkun, E; Cui, B; Carmody, M; Peng, L; Grayson, M; Phillips, J; (Northwestern University, Northwestern Scholars,) Analysis of Carrier Transport in n-Type $Hg_{1-x}Cd_xTe$ with Ultra-Low Doping Concentration, Journal of Electronic Materials, Issue 10/2018.

I claim:

1. A thermoelectric energy generator utilizing the ExB drift effect, said thermoelectric generator comprising:
    a) layers comprising a semiconductor material at a semiconductor temperature, said layers having a layer thickness and said layer having a multiplicity of at least one;
    b) a thermal contact for transferring heat from a heat source to said layers;
    c) no thermal contact to any heat sink;
    d) electrical carriers in said semiconductor, comprising electrons and holes, said electrons having an electron concentration and said holes having a hole concentration, said electron concentration and said hole concentration in combination being called carrier concentration;
    e) said semiconductor material being in a depletion mode, a maximum carrier concentration being defined as a value of said carrier concentration below which said semiconductor material remains in said depletion mode;
    f) said electrons having electron properties;
    g) said holes having hole properties generally different from said electron properties;
    h) a magnetic field along a magnetic axis essentially parallel to said layers;
    i) an electric field along an electric axis essentially perpendicular to said layers;
    j) said magnetic field and said electric field in combination producing said ExB drift of said electrical carriers;
    k) said electrons carried by said ExB drift, traveling along cycloid orbits with an electron drift speed and in an electron drift direction in accordance with their said electron properties, said electron drift direction not generally aligned with said electric field, said electrons producing an electron negative current;
    l) said holes carried by said ExB drift, traveling along cycloid orbits with a hole drift speed and in a hole drift direction distinct from said electron drift speed and said electron drift direction respectively, said hole drift direction not generally aligned with said electric field, in accordance with their said hole properties, said hole producing a hole positive current;
    m) said electron negative current and said hole positive current, not being equal to each other in magnitude and direction, and not cancelling each other out, and producing a net output current;
    n) electrodes in contact with said layers, said electrodes capturing said net output current, and not generating said electric field, said net output current being accompanied by an output voltage;
    o) said carriers contributing a largest current being called overriding carriers, their said largest current, overriding current, their said properties, overriding properties, and furthermore, said carriers contributing a smallest current being called overridden carriers, their said smallest current, overridden current, their said properties, overridden properties;
    p) said electrodes having a polarity determined by said ExB drift and said properties of said overriding carriers.

2. The thermoelectric energy generator of claim 1 wherein said electrical carriers drifting according to said ExB drift, carry with them heat phonons, thereby causing a temperature difference in said layers between said electrodes, said layers acquiring a hot end and a cold end, said cold end thermally connected to said heat source.

3. The thermoelectric energy generator of claim 1 wherein said electrical carriers drifting according to said ExB drift, carry with them heat phonons, thereby causing a temperature difference in said layers between said electrodes, said layers acquiring a hot end and a cold end, said cold end thermally connected to said hot end.

4. The thermoelectric energy generator of claim 1 wherein a minimum band gap is defined as a value above which said carrier concentration remains smaller than said maximum carrier concentration, said semiconductor material having a band gap larger than said minimum band gap.

5. The thermoelectric energy generator of claim 1 wherein said semiconductor has a band gap greater than the product kB and T, where kB is Boltzmann's constant and T is said semiconductor temperature.

6. The thermoelectric energy generator of claim 1 wherein a maximum doping level is defined as a value below which said carrier concentration remains smaller than said maximum carrier concentration, said semiconductor material is doped below maximum doping level.

7. The thermoelectric energy generator of claim 1 wherein a ratio of said maximum carrier concentration to said carrier concentration ranges between 1.2 and 10.

8. The thermoelectric energy generator of claim 1 wherein a ratio of said maximum carrier concentration to said carrier concentration ranges between 1.5 and 3.

9. The thermoelectric energy generator of claim 1 wherein said overriding properties include an overriding mobility, said overriding current is enhanced by selecting a product of said magnetic field and said overriding mobility between 1 and 3.

10. The thermoelectric energy generator of claim 1 wherein said overridden properties include an overridden mobility, said overridden current is reduced by selecting a product of said magnetic field and said overridden mobility outside of the range between 1 and 3.

11. The thermoelectric energy generator of claim 1 wherein:
   a) said overriding carriers follow overriding cycloid paths dimensionally commensurate with a cyclotron orbit having an overriding diameter being a function of said overriding properties, and said magnetic field;
   b) said overriding carriers having a probabilistically distributed velocity, resulting in said overriding diameter being probabilistically distributed, and having an average overriding diameter;
   c) said overridden carriers follow overridden cycloid paths dimensionally commensurate with a cyclotron orbit having an overridden diameter being a function of said overridden properties, and said magnetic field;
   d) said overridden carriers having a probabilistically distributed velocity, resulting in said overridden diameter being probabilistically distributed, and having an average overridden diameter;
   e) said average overriding diameter being smaller than said average overridden diameter; and
   f) said layer thickness larger than said average overriding diameter and smaller than said average overridden diameter.

12. The thermoelectric energy generator of claim 1 wherein:
   d) said overriding carriers drift in an overriding drift direction in accordance with their said overriding properties;
   e) said overridden carriers drift in an overridden drift direction in accordance with their said overridden properties;
   f) said overriding drift direction being different from said overridden drift direction;
   d) said electrodes are positioned along an electrode axis at an electrode axis angle closer to said overriding carrier drift direction than said overridden drift direction.

13. The thermoelectric energy generator of claim 1 wherein:
   a) said layer thickness defined as the distance between a bottom surface of said layers and a top surface of said layers;
   b) a first of said electrodes is placed on said top surface;
   c) a second of said electrodes is placed on said bottom surface, offset from said first electrodes by a layer length along said bottom surface, and in a direction perpendicular to said magnetic field;
   d) a ratio of said layer length to said layer thickness being essentially equal to the product of said overriding mobility and said magnetic field.

14. The thermoelectric energy generator of claim 1 wherein said magnetic field is produced by a magnetic source selected from the group consisting of a permanent magnet, a superconducting magnet, and an electromagnet.

15. The thermoelectric energy generator of claim 1 wherein said layers are arranged in a stack.

16. The thermoelectric energy generator of claim 1 wherein said layers are arranged in a stack, and wherein said overriding carriers in said layers in said stack alternate between said electrons and said holes.

17. The thermoelectric energy generator of claim 1 wherein said layers are arranged in a stack and wherein said electric field in said layers in said stack, alternatively points in an opposite direction.

18. The thermoelectric energy generator of claim 1 wherein said layers are arranged in a stack and said layers are separated from each other by an insulator.

19. The thermoelectric energy generator of claim 1 wherein said layers are arranged in a stack and said layers are separated from each other by a semi-insulator comprising indium phosphide.

20. The thermoelectric energy generator of claim 1 wherein said electric field is produced by insulated capacitor plates on either side of, and forming a sandwich with, each said layers.

21. The thermoelectric energy generator of claim 1 wherein said electric field is produced by electrets or ferroelectric material on either side of, and forming a sandwich with, each said layers.

22. The thermoelectric energy generator of claim 1 wherein said electric field is produced by a junction.

23. The thermoelectric energy generator of claim 1 wherein each said layers have a surface, said electric field is produced by doping said surface.

24. The thermoelectric energy generator of claim 1 wherein each said layers have a surface, said electric field is produced by doping said surface, said surface doping being striated in a direction parallel to said magnetic field.

25. The thermoelectric energy generator of claim 1 wherein said electrodes form a contact with said semiconductor, said contact doped to preferably produce overriding carriers.

26. The thermoelectric energy generator of claim 1 wherein said layers comprise a material selected from the group consisting of indium antimonide, indium arsenide, and alloys thereof.

27. The thermoelectric energy generator of claim 1 wherein said layers comprise a material selected from the group consisting of indium phosphide, gallium indium arsenide and mercury cadmium telluride.

28. The thermoelectric energy generator of claim 1 wherein said layers comprise a material selected from the group consisting of graphene and graphite.

29. The thermoelectric energy generator of claim 1 wherein said thermal contact has a thermal conductance which can be operationally altered.

30. The thermoelectric energy generator of claim 1 wherein said heat source is at a heat source temperature below 300° K.

31. The thermoelectric energy generator of claim 1 wherein
   a) said electrodes are electrically shorted together;
   b) said electrical carriers drifting according to said ExB drift, carrying with them heat phonons, and causing a temperature difference in said layers between said electrodes, said layers acquiring a hot end and a cold end;
   c) said cold end thermally connected to said heat source, said hot end available as a heat supply.

* * * * *